(12) United States Patent
Saito et al.

(10) Patent No.: US 11,646,251 B2
(45) Date of Patent: May 9, 2023

(54) SEMICONDUCTOR DEVICE

(71) Applicant: Rohm Co., Ltd., Kyoto (JP)

(72) Inventors: Koshun Saito, Kyoto (JP); Tsuyoshi Tachi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 119 days.

(21) Appl. No.: 17/371,647

(22) Filed: Jul. 9, 2021

(65) Prior Publication Data

US 2021/0335697 A1    Oct. 28, 2021

Related U.S. Application Data

(63) Continuation of application No. 16/744,743, filed on Jan. 16, 2020, now Pat. No. 11,081,432.

(30) Foreign Application Priority Data

Jan. 18, 2019   (JP) .............................. JP2019-006676

(51) Int. Cl.
    *H01L 23/495*     (2006.01)
    *H01L 29/20*     (2006.01)
    (Continued)

(52) U.S. Cl.
    CPC .... *H01L 23/49562* (2013.01); *H01L 23/3121* (2013.01); *H01L 24/48* (2013.01);
    (Continued)

(58) Field of Classification Search
    CPC ........... H01L 29/2003; H01L 23/49562; H01L 29/7786; H01L 23/3121; H01L 24/48;
    (Continued)

(56) References Cited

U.S. PATENT DOCUMENTS

2005/0159000 A1    7/2005    Ohno et al.
2017/0316997 A1    11/2017    Saito

FOREIGN PATENT DOCUMENTS

JP    2012-38885 A    2/2012
JP    2015-65213 A    4/2015
(Continued)

OTHER PUBLICATIONS

Office Action received in the corresponding Japanese Patent application, dated Oct. 25, 2022, and machine translation (10 pages).

*Primary Examiner* — Robert G Bachner
(74) *Attorney, Agent, or Firm* — Hamre, Schumann, Mueller & Larson, P.C.

(57) ABSTRACT

The semiconductor device includes a semiconductor element, a first lead, and a second lead. The semiconductor element has an element obverse surface and an element reverse surface spaced apart from each other in a thickness direction. The semiconductor element includes an electron transit layer disposed between the element obverse surface and the element reverse surface and formed of a nitride semiconductor, a first electrode disposed on the element obverse surface, and a second electrode disposed on the element reverse surface and electrically connected to the first electrode. The semiconductor element is mounted on the first lead, and the second electrode is joined to the first lead. The second lead is electrically connected to the first electrode. The semiconductor element is a transistor. The second lead is spaced apart from the first lead and is configured such that a main current to be subjected to switching flows therethrough.

20 Claims, 14 Drawing Sheets

(51) Int. Cl.
 *H01L 29/778* (2006.01)
 *H01L 23/31* (2006.01)
 *H01L 23/00* (2006.01)

(52) U.S. Cl.
 CPC .......... *H01L 24/49* (2013.01); *H01L 29/2003* (2013.01); *H01L 29/7786* (2013.01); *H01L 2224/48091* (2013.01); *H01L 2224/48106* (2013.01); *H01L 2224/48175* (2013.01); *H01L 2224/49175* (2013.01); *H01L 2924/1033* (2013.01); *H01L 2924/13064* (2013.01)

(58) Field of Classification Search
 CPC ........... H01L 24/49; H01L 2924/13064; H01L 2224/48175; H01L 2924/1033
 See application file for complete search history.

(56) References Cited

FOREIGN PATENT DOCUMENTS

| | | |
|---|---|---|
| JP | 2017-228621 A | 12/2017 |
| JP | 2018-82011 A | 5/2018 |
| WO | 2018/061711 A1 | 5/2018 |

SEMICONDUCTOR DEVICE

FIELD

The present disclosure relates to a semiconductor device.

BACKGROUND

Heretofore, semiconductor elements using a group III-V nitride semiconductor ("nitride semiconductor") such as gallium nitride (GaN) have been developed. JP-A-2012-38885 discloses an example of such a semiconductor element. The semiconductor element disclosed in JP-A-2012-38885 includes a substrate, a nitride semiconductor layer formed on the obverse surface of the substrate, and a plurality of electrodes. The electrodes include a source electrode, a drain electrode, a gate electrode, and a back electrode. The source electrode, the drain electrode, and the gate electrode are disposed on the nitride semiconductor layer. The back electrode is disposed on the reverse surface of the substrate and is electrically connected to the source electrode via a conductive portion that passes through both the substrate and the nitride semiconductor layer.

The above-described semiconductor element constitutes a semiconductor device together with a plurality of leads and a sealing resin, for example. The plurality of leads include a source lead, a drain lead, and a gate lead. The source lead is a component on which the semiconductor element is mounted, and is electrically connected to the back electrode (thus also electrically connected to the source electrode). The drain lead is electrically connected to the drain electrode, and the gate lead is electrically connected to the gate electrode. The sealing resin covers the semiconductor element and the respective leads. The respective leads are partially exposed from the sealing resin, and the exposed portions are used as external connection terminals. In this semiconductor device, the source lead is electrically connected to the back electrode and the source electrode, whereby a current circulation path is formed by the source lead, the source electrode, the conductive portion, and the back electrode. Part of this circulation path extends along the lamination direction of the nitride semiconductor layer. Accordingly, when a current flows through this circulation path, electrons may be trapped in crystal defects in the nitride semiconductor layer. This may change the properties of the nitride semiconductor layer, resulting in reduced reliability of the semiconductor element.

SUMMARY

In light of the foregoing, it is an object of the present disclosure to provide a semiconductor device that can suppress the flow of a current in the lamination direction of a nitride semiconductor layer.

One aspect of the present disclosure provides a semiconductor device including: a semiconductor element having an element obverse surface and an element reverse surface that are spaced apart from each other in a thickness direction, the semiconductor element including an electron transit layer that is disposed between the element obverse surface and the element reverse surface and is formed of a nitride semiconductor, a first electrode that is disposed on the element obverse surface, and a second electrode that is disposed on the element reverse surface and is electrically connected to the first electrode; a first lead on which the semiconductor element is mounted, the first lead being joined to the second electrode; and a second lead that is electrically connected to the first electrode. The semiconductor element is a transistor, and the second lead is spaced apart from the first lead and is configured such that a main current to be subjected to switching flows through the second lead.

According to the above-described configuration, the first lead to which the second electrode is joined and the second lead electrically connected to the first electrode are spaced apart from each other. Accordingly, a current circulation path including the first lead, the second electrode, the first electrode, and the second lead is not formed. As a result, a current is kept from flowing along the lamination direction of a nitride semiconductor layer.

Other characteristics and advantages of the present disclosure will become more apparent by the following detailed description with reference to the accompanying drawings.

EMBODIMENTS

Figure 1:
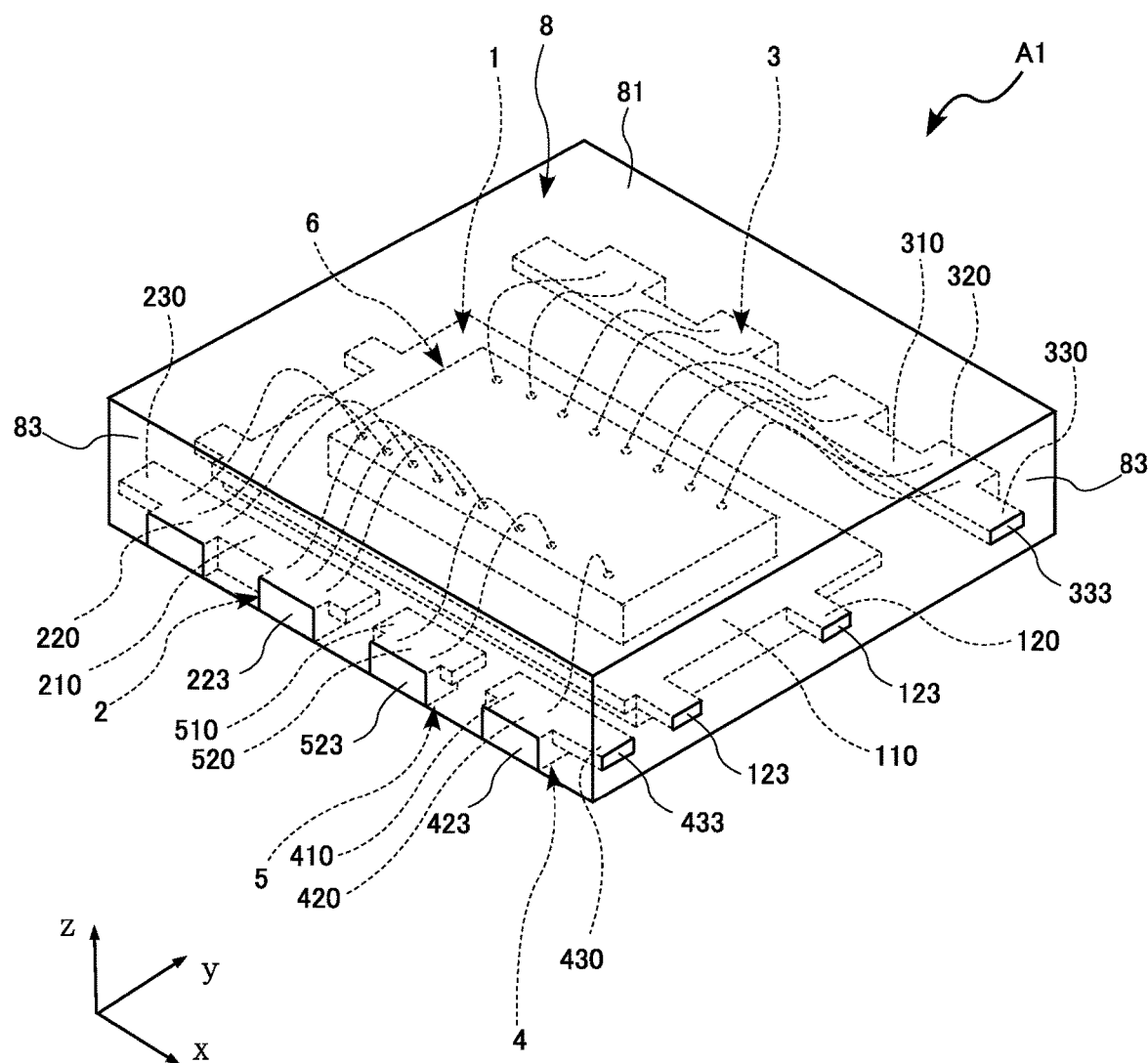
FIG. 1 is a perspective view showing a semiconductor device according to Example 1.

The present disclosure will be described in detail by way of various examples with reference to the accompanying drawings.

A semiconductor device A1 according to Example 1 will be described with reference to FIGS. 1 to 7. The semiconductor device A1 includes a plurality of leads, a semiconductor element 6, bonding wires 71 to 74, and a sealing resin 8. In the example illustrated in these drawings, the plurality of leads include first to fifth leads 1 to 5. In FIG. 2, the sealing resin 8 is not shown and the outer shape thereof is indicated with an imaginary line (double-dot-dash line).

The semiconductor device A1 is surface-mountable on circuit boards of various apparatuses. The semiconductor device A1 has a rectangular shape as viewed in the thickness direction (z direction). Two directions that are orthogonal to the z direction and also are orthogonal to each other are defined as the x direction and the y direction. For example, as shown in FIG. 2, one side of the semiconductor device A1 extends along the x direction, and another side of the semiconductor device A1 extends along the y direction. The size of the semiconductor device A1 is not particularly limited, and may be such that, for example, the dimension in the x direction is about 1 to 10 mm, the dimension in the y direction is about 1 to 10 mm, and the dimension in the z direction is about 0.3 to 3 mm.

As described in the following, the leads 1 to 5 support the semiconductor element 6 and/or are electrically connected to the semiconductor element 6. The leads 1 to 5 are made of metal, and are preferably made of either Cu or Ni, or an alloy of Cu and Ni, a 42 alloy, or the like. The leads 1 to 5 can be formed through punching, bending, or the like of a metal plate. The leads 1 to 5 each have a thickness of 0.08 to 0.5 mm, for example. In the example illustrated in the drawings, the leads 1 to 5 are each made of Cu and each have a thickness of about 0.5 mm.

As shown in FIG. 2, the semiconductor device A1 has two sides that are spaced apart from each other in the y direction (each side extends along the x direction). The first lead 1 is disposed closer to one of these two sides (closer to the lower side in FIG. 2). In other words, the first lead 1 is disposed closer to the lower side than to the upper side of the semiconductor device A1. The first lead 1 extends over the entire width of the semiconductor device A1 in the x direction.

The second lead 2 and the third lead 3 are provided on sides opposite to each other in the y direction with respect to the first lead 1. The second lead 2 and the third lead 3 are each spaced apart from the first lead 1. As shown in FIG. 2, the second lead 2 is adjacent to the lower side and the left side (extending along the y direction) of the semiconductor device A1. The third lead 3 is adjacent to the upper side of the semiconductor device A1 and extends from the left side to the right side (extending along the y direction) of the semiconductor device A1. That is, the third lead 3 extends over the entire width of the semiconductor device A1 in the x direction.

The fourth lead 4 and the fifth lead 5 are provided on the same side as the second lead 2 in the y direction with respect to the first lead 1. In FIG. 2, the fourth lead 4 and the fifth lead 5 are each provided adjacent to the lower side of the semiconductor device A1. The fourth lead 4 and the fifth lead 5 are spaced apart from each other, and they are each spaced apart from the first lead 1. The fifth lead 5 is disposed between the second lead 2 and the fourth lead 4 in the x direction. That is, the second lead 2, the fifth lead 5, and the fourth lead 4 are spaced apart from each other and disposed in this order in the x direction.

The dimension of the first lead 1 as viewed in the z direction is larger than those of the remaining leads 2 to 5. The dimensions of the leads 2 to 5 in the x direction are as follows: the dimension of the third lead 3 is the largest, and the dimensions of the remaining leads decrease in the order of the second lead 2, the fourth lead 4, and the fifth lead 5. In the y direction, the distance between the third lead 3 and the first lead 1 is greater than the distance between the second lead 2 (or the fifth lead 5, the fourth lead 4) and the first lead 1.

The first lead 1 includes a mounting portion 110 and a plurality of coupling portions 120. In the example illustrated in the drawings, four coupling portions 120 are provided. However, the present disclosure is not limited thereto.

Figure 3:
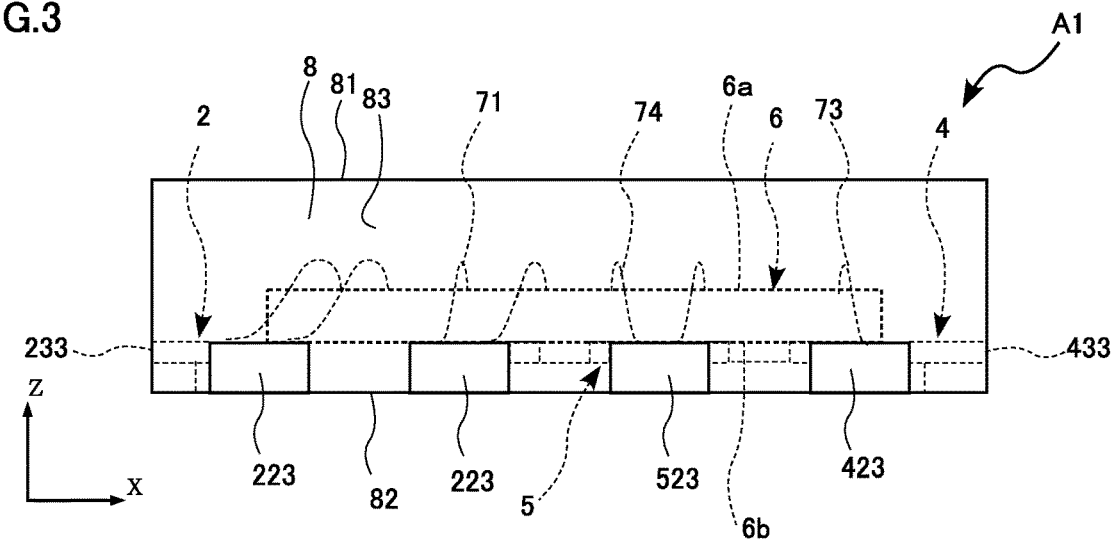
FIG. 3 is a front view of the semiconductor device shown in FIG. 1.
Figure 4:
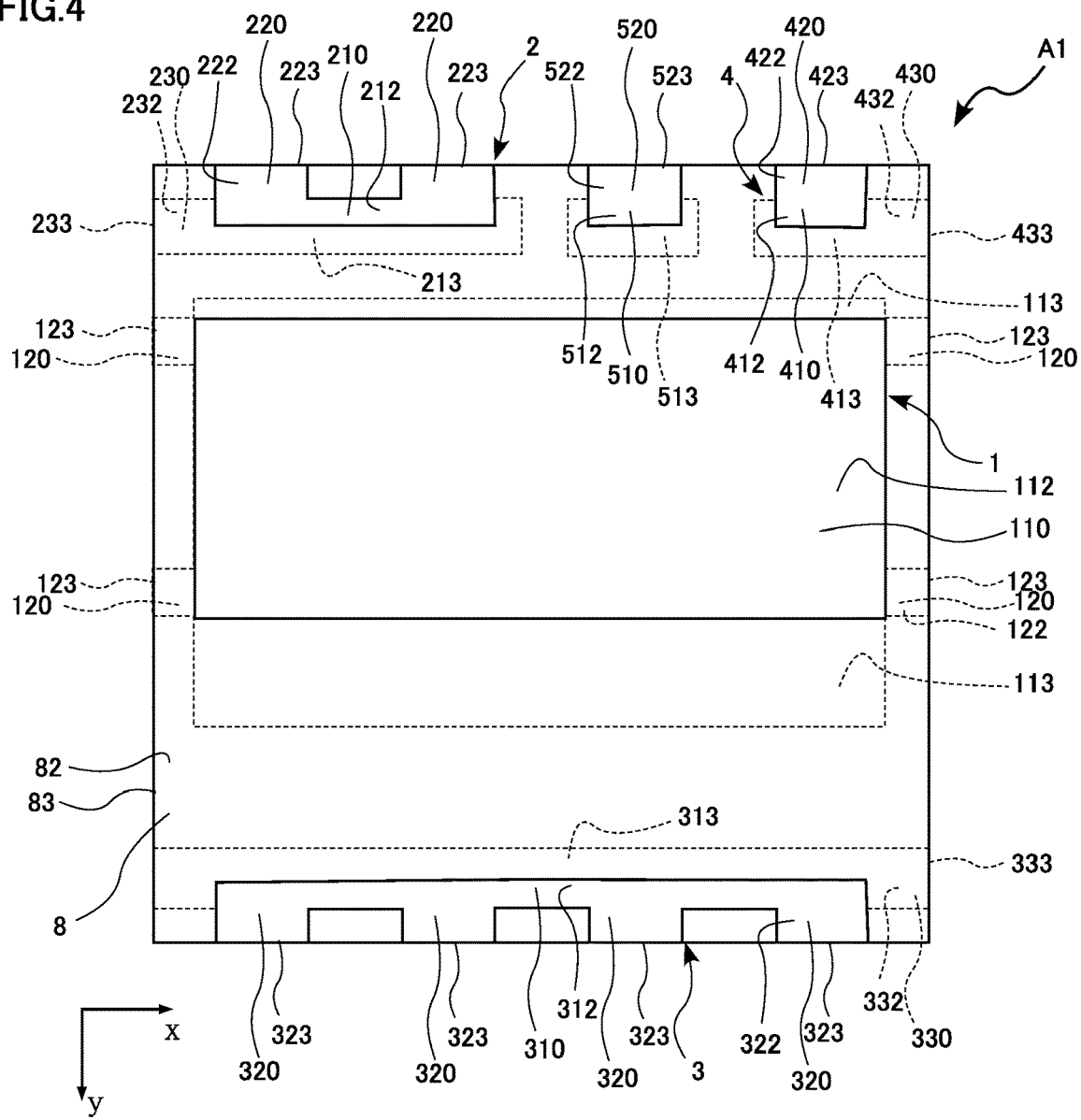
FIG. 4 is a bottom view of the semiconductor device shown in FIG. 1.

The mounting portion 110, which is a major portion of the first lead 1, has a rectangular shape as viewed in the z direction. The mounting portion 110 has an obverse surface 111 (FIG. 2) and a reverse surface 112 (FIG. 4). The obverse surface 111 and the reverse surface 112 face away from each other in the z direction. The obverse surface 111 is a surface that faces upward in FIG. 3 and on which the semiconductor element 6 is mounted. The reverse surface 112 is a surface that faces downward in FIG. 3 and is exposed from the sealing resin 8 to serve as a back terminal. The mounting portion 110 has at least one recess 113. In the example illustrated in FIG. 4, two recesses 113 (each recess is elongated in the x direction) are formed spaced apart from each other in the y direction. In FIG. 4, the dimension of the upper recess 113 (adjacent to the second lead 2) in the y direction is smaller than that of the lower recess 113 (adjacent to the third lead). On the other hand, the upper recess 113 and the lower recess 113 have the same dimension in the x direction. Accordingly, the area of the upper recess 113 as viewed in the z direction is smaller than that of the lower recess 113. The respective recesses 113 are portions of the mounting portion 110 recessed from the reverse surface 112 in the z direction. The thickness (the dimension in the z direction) of each of the portions of the mounting portion 110 provided with the recesses 113 is about one-half of the thickness of the portion of the mounting portion 110 provided with the reverse surface 112 (the distance between the obverse surface 111 and the reverse surface 112). Each recess 113 is formed by, for example, subjecting the mounting portion 110 (the first lead 1) to half etching.

As shown in FIG. 2, each coupling portion 120 is connected to the mounting portion 110 and has a rectangular shape as viewed in the z direction. In the example illustrated in the drawings, the mounting portion 110 has two end surfaces that are spaced apart from each other in the x direction and parallel to each other, and two coupling portions 120 are disposed on each end surface. Each coupling portion 120 has an obverse surface 121 (FIG. 2), a reverse surface 122 (FIG. 4), and an end surface 123 (FIGS. 2 and 4). The obverse surface 121 and the reverse surface 122 face away from each other in the z direction. The obverse surface 121 of each coupling portion faces upward in FIG. 3 and is flush with the obverse surface 111 of the mounting portion. The reverse surface 122 of each coupling portion faces downward in FIG. 3. The thickness (the dimension in the z direction) of each coupling portion 120 is about the same as the thickness of each of the portions of the mounting portion 110 provided with the recesses 113. Each coupling portion 120 is formed by, for example, subjecting the first lead 1 to half etching. In each coupling portion, the end surface 123 is a surface connecting the obverse surface 121 and the reverse surface 122, faces outward in the x direction, and is exposed from the sealing resin 8 (see FIG. 1).

The second lead 2 is disposed at a corner (the lower left corner in FIG. 2) of the semiconductor device A1 as viewed in the z direction, and includes a wire bonding portion 210, two terminal portions 220, and a coupling portion 230.

The wire bonding portion 210 has a rectangular shape elongated in the x direction as viewed in the z direction. The wire bonding portion 210 has an obverse surface 211, a reverse surface 212, and a recess 213. The obverse surface 211 and the reverse surface 212 face away from each other in the z direction. The obverse surface 211 is a surface that faces upward in FIG. 3 and to which the bonding wires 71 are bonded. The reverse surface 212 is a surface that faces downward in FIG. 3 and is exposed from the sealing resin 8 to serve as a back terminal (see FIG. 4). The recess 213 is a portion of the wire bonding portion 210 recessed from the reverse surface 212 in the z direction. The thickness (the dimension in the z direction) of a portion of the wire bonding portion 210 provided with the recess 213 is about one-half of the thickness of a portion of the wire bonding portion 210 provided with the reverse surface 212. The recess 213 is formed by, for example, subjecting the second lead 2 to half etching.

Each terminal portion 220 is connected to the wire bonding portion 210 and has a rectangular shape as viewed in the z direction. In the example illustrated in the drawings, two terminal portions 220 are disposed on one end surface (end surface that faces away from the semiconductor device A1) of the wire bonding portion 210 so as to be spaced apart from each other in the x direction. Each terminal portion 220 has an obverse surface 221, a reverse surface 222, and an end surface 223. The obverse surface 221 and the reverse surface 222 face away from each other in the z direction. The obverse surface 221 faces upward in FIG. 3. The obverse surface 221 of the terminal portion is flush with the obverse surface 211 of the wire bonding portion. The reverse surface 222 faces downward in FIG. 3. The reverse surface 222 of the terminal portion is flush with the reverse surface 212 of the wire bonding portion. The end surface 223 is a surface connecting the obverse surface 221 and the reverse surface 222 and faces outward in the y direction. The reverse surface 212 of the wire bonding portion, the reverse surfaces 222 of the terminal portions, and the end surfaces 223 of the terminal portions are exposed from the sealing resin 8 and connected to each other to function as an external connection terminal.

The coupling portion 230 is connected to the outer side of the wire bonding portion 210 in the x direction (the left side in FIG. 2). The thickness (the dimension in the z direction) of the coupling portion 230 is about the same as the thickness of a portion of the wire bonding portion 210 provided with the recess 213. The coupling portion 230 is formed by, for example, subjecting the second lead 2 to half etching. The coupling portion 230 has an obverse surface 231, a reverse surface 232, and an end surface 233. The obverse surface 231 and the reverse surface 232 face away from each other in the z direction. The obverse surface 231 faces upward in FIG. 3. The obverse surface 231 of the coupling portion is flush with the obverse surface 211 of the wire bonding portion. Accordingly, the obverse surface 211 of the wire bonding portion, the obverse surfaces 221 of the terminal portions, and the obverse surface of the coupling portion 231 together form a flat surface (see FIG. 2). The reverse surface 232 faces downward in FIG. 3. Of surfaces connecting the obverse surface 231 and the reverse surface 232, the end surface 233 is a surface facing in the x direction and is exposed from the sealing resin 8.

In FIG. 2, the third lead 3 is disposed adjacent to the upper side of the semiconductor device A1 and extends over the entire width of the semiconductor device A1 in the x direction. The third lead 3 includes a wire bonding portion 310, a plurality of terminal portions 320, and a plurality of coupling portions 330.

The wire bonding portion 310 has a rectangular shape elongated in the x direction as viewed in the z direction. The wire bonding portion 310 has an obverse surface 311, a reverse surface 312, and a recess 313. The obverse surface 311 and the reverse surface 312 face away from each other in the z direction. The obverse surface 311 faces upward in FIG. 3. The obverse surface 311 is a surface to which the bonding wires 72 are bonded. The reverse surface 312 faces downward in FIG. 3. The reverse surface 312 is exposed from the sealing resin 8 to serve as a back terminal. The recess 313 is a portion of the wire bonding portion 310 recessed from the reverse surface 312 in the z direction. The thickness (the dimension in the z direction) of a portion of the wire bonding portion 310 provided with the recess 313 is about one-half of the thickness of a portion of the wire bonding portion 310 provided with the reverse surface 312. The recess 313 is formed by, for example, subjecting the third lead 3 to half etching.

Each terminal portion 320 is connected to the wire bonding portion 310 and has a rectangular shape as viewed in the z direction. In the example illustrated in FIG. 2, four terminal portions 320 are disposed on one end surface (end surface that faces away from the semiconductor device A1) of the wire bonding portion 310 so as to be spaced apart from each other in the x direction. Each terminal portion 320 has an obverse surface 321, a reverse surface 322, and an end surface 323. The obverse surface 321 and the reverse surface 322 face away from each other in the z direction. The obverse surface 321 faces upward in FIG. 3. The obverse surface 321 of each terminal portion is flush with the obverse surface 311 of the wire bonding portion. The reverse surface 322 faces downward in FIG. 3. The reverse surface 322 of each terminal portion is flush with the reverse surface 312 of the wire bonding portion. The end surface 323 is a surface connecting the obverse surface 321 and the reverse surface 322 and faces outward in the y direction. The reverse surface 312 of the wire bonding portion, the reverse surfaces 322 of the terminal portions, and the end surfaces 323 of the terminal portions are exposed from the sealing resin 8 and connected to each other to function as an external connection terminal.

In the example illustrated in FIG. 2, two coupling portions 330 are connected to both ends of the wire bonding portion 310 in the x direction, respectively. The thickness (the dimension in the z direction) of each coupling portion 330 is about the same as the thickness of a portion of the wire bonding portion 310 provided with the recess 313. The coupling portions 330 are formed by, for example, subjecting the third lead 3 to half etching. Each coupling portion 330 has an obverse surface 331, a reverse surface 332, and an end surface 333. The obverse surface 331 and the reverse surface 332 face away from each other in the z direction. The obverse surface 331 faces upward in FIG. 3. The obverse surface 331 of each coupling portion is flush with the obverse surface 311 of the wire bonding portion. Accordingly, the obverse surface 311 of the wire bonding portion, the obverse surfaces 321 of the terminal portions, and the obverse surfaces of the coupling portions 331 together form a flat surface (see FIG. 2). The reverse surface 332 faces downward in FIG. 3. Of surfaces connecting the obverse surface 331 and the reverse surface 332, the end surface 333 is a surface facing in the x direction and is exposed from the sealing resin 8.

In FIG. 2, the fourth lead 4 is disposed at the lower right corner of the semiconductor device A1, and includes a wire bonding portion 410, a terminal portion 420, and a coupling portion 430.

The wire bonding portion 410 has a rectangular shape elongated in the x direction as viewed in the z direction. The wire bonding portion 410 has an obverse surface 411, a reverse surface 412, and a recess 413. The obverse surface 411 and the reverse surface 412 face away from each other in the z direction. The obverse surface 411 faces upward in FIG. 3. The obverse surface 411 is a surface to which the bonding wire 73 is bonded. The reverse surface 412 faces downward in FIG. 3. The reverse surface 412 is exposed from the sealing resin 8 to serve as a back terminal. The recess 413 is a portion of the wire bonding portion 410 recessed from the reverse surface 412 in the z direction. The thickness (the dimension in the z direction) of a portion of the wire bonding portion 410 provided with the recess 413 is about one-half of the thickness of a portion of the wire bonding portion 410 provided with the reverse surface 412. The recess 413 is formed by, for example, subjecting the fourth lead 4 to half etching.

The terminal portion 420 is connected to the wire bonding portion 410 and has a rectangular shape as viewed in the z direction. The terminal portion 420 is disposed on one end surface (end surface that faces away from the semiconductor device A1) of the wire bonding portion 410. The terminal portion 420 has an obverse surface 421, a reverse surface 422, and an end surface 423. The obverse surface 421 and the reverse surface 422 face away from each other in the z direction. The obverse surface 421 faces upward in FIG. 3. The obverse surface 421 of the terminal portion is flush with the obverse surface 411 of the wire bonding portion. The reverse surface 422 faces downward in FIG. 3. The reverse surface 422 of the terminal portion is flush with the reverse surface 412 of the wire bonding portion. The end surface 423 is a surface connecting the obverse surface 421 and the reverse surface 422 and faces outward in the y direction. The reverse surface 412 of the wire bonding portion, the reverse surface 422 of the terminal portion, and the end surface 423 of the terminal portion are exposed from the sealing resin 8 and connected to each other to function as an external connection terminal.

In FIG. 2, the coupling portion 430 is connected to the right side of the wire bonding portion 410 in the x direction. The thickness (the dimension in the z direction) of the coupling portion 430 is about the same as the thickness of a portion of the wire bonding portion 410 provided with the recess 413. The coupling portion 430 is formed by, for example, subjecting the fourth lead 4 to half etching. The coupling portion 430 has an obverse surface 431, a reverse surface 432, and an end surface 433. The obverse surface 431 and the reverse surface 432 face away from each other in the z direction. The obverse surface 431 faces upward in FIG. 3. The obverse surface 431 of the coupling portion is flush with the obverse surface 411 of the wire bonding portion. Accordingly, the obverse surface 411 of the wire bonding portion, the obverse surface 421 of the terminal portion, and the obverse surface 431 of the coupling portion together form a flat surface (see FIG. 2). The reverse surface 432 faces downward in FIG. 3. Of surfaces connecting the obverse surface 431 and the reverse surface 432, the end surface 433 is a surface facing in the x direction and is exposed from the sealing resin 8.

In FIG. 2, as viewed in the z direction, the fifth lead 5 is adjacent to the lower side of the semiconductor device A1 and is disposed between the second lead 2 and the fourth lead 4. The fifth lead 5 includes a wire bonding portion 510 and a terminal portion 520.

The wire bonding portion 510 has a rectangular shape elongated in the x direction as viewed in the z direction. The wire bonding portion 510 has an obverse surface 511, a reverse surface 512, and a recess 513. The obverse surface 511 and the reverse surface 512 face away from each other in the z direction. The obverse surface 511 faces upward in FIG. 3. The obverse surface 511 is a surface to which the bonding wires 74 are bonded. The reverse surface 512 faces downward in FIG. 3. The reverse surface 512 is exposed from the sealing resin 8 to serve as a back terminal. The recess 513 is a portion of the wire bonding portion 510 recessed from the reverse surface 512 in the z direction. The thickness (the dimension in the z direction) of a portion of the wire bonding portion 510 provided with the recess 513 is about one-half of the thickness of a portion of the wire bonding portion 510 provided with the reverse surface 512. The recess 513 is formed by, for example, subjecting the fifth lead 5 to half etching.

The terminal portion 520 is connected to the wire bonding portion 510 and has a rectangular shape as viewed in the z direction. In FIG. 2, the terminal portion 520 is disposed on one end surface (end surface that faces away from the semiconductor device A1) of the wire bonding portion 510. The terminal portion 520 has an obverse surface 521, a reverse surface 522, and an end surface 523. The obverse surface 521 and the reverse surface 522 face away from each other in the z direction. The obverse surface 521 faces upward in FIG. 3. The obverse surface 521 of the terminal portion is flush with the obverse surface 511 of the wire bonding portion. The reverse surface 522 faces downward in FIG. 3. The reverse surface 522 of the terminal portion is flush with the reverse surface 512 of the wire bonding portion. The end surface 523 is a surface connecting the obverse surface 521 and the reverse surface 522, and faces outward in the y direction. The reverse surface 512 of the wire bonding portion, the reverse surface 522 of the terminal portion, and the end surface 523 of the terminal portion are exposed from the sealing resin 8 and connected to each other to function as an external connection terminal.

The semiconductor element 6 is a component that performs electrical functions of the semiconductor device A1. The semiconductor element 6 is a semiconductor element using a nitride semiconductor. In the present example, the semiconductor element 6 is a high electron mobility transistor (HEMT) using gallium nitride (GaN). The semiconductor element 6 includes an element body 60, first electrodes 61, a second electrode 62, third electrodes 63, and fourth electrodes 64.

Figure 7:
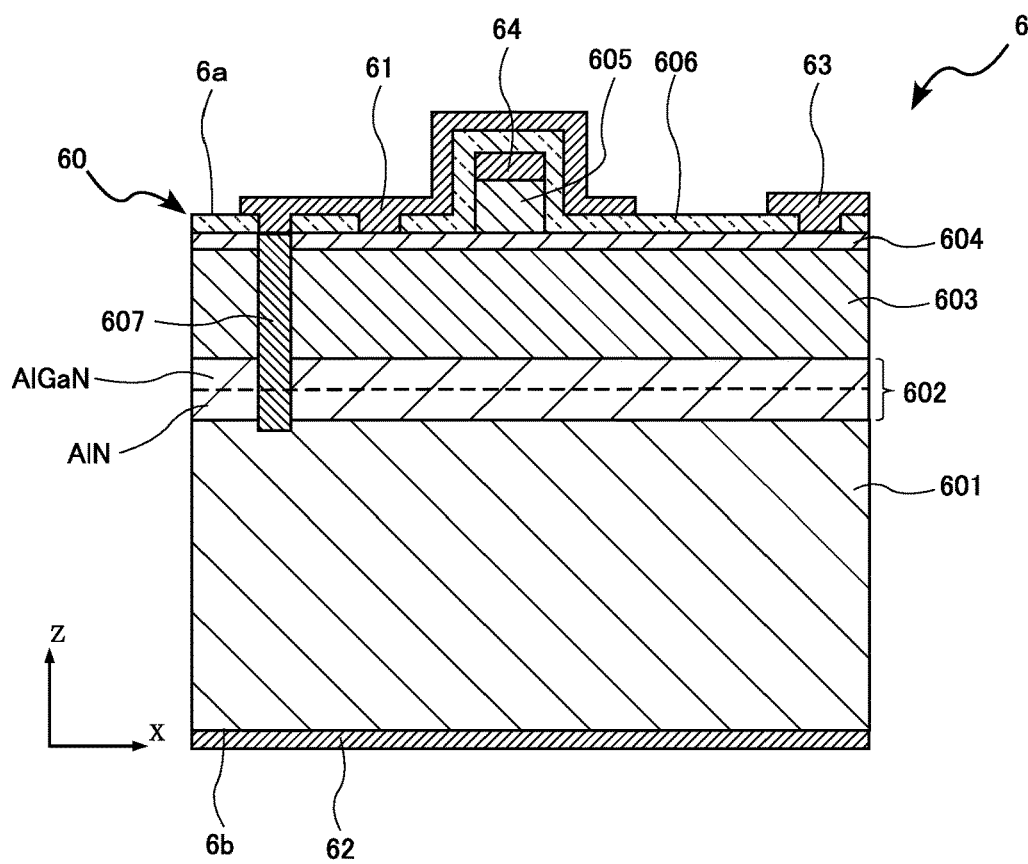
FIG. 7 is a schematic cross-sectional view showing the semiconductor element.

The element body 60 has an obverse surface 6a and a reverse surface 6b. As shown in FIG. 3 etc., the obverse surface 6a and the reverse surface 6b face away from each other in the z direction. The obverse surface 6a faces upward in FIG. 3, and the reverse surface 6b faces downward in FIG. 3. As shown in FIG. 7, the element body 60 includes a substrate 601, a buffer layer 602, a first nitride semiconductor layer 603, a second nitride semiconductor layer 604, a third nitride semiconductor layer 605, a protective layer 606, and a conductive portion 607.

The substrate 601 is, for example, an Si substrate and has a predetermined low resistance value. The thickness (the dimension in the z direction) of the substrate 601 is about 400 to 600 μm. The buffer layer 602 is formed on the substrate 601 and has a multilayer structure composed of a plurality of nitride semiconductor layers. In the example illustrated in the drawings, the buffer layer 602 is composed of a first buffer layer (which is an AlN film) in contact with the substrate 601 and a second buffer layer (which is an AlGaN film) laminated on the first buffer layer. The first nitride semiconductor layer 603 is a GaN layer formed on the buffer layer 602 through epitaxial growth and serves as an electron transit layer. The second nitride semiconductor layer 604 is an AlGaN layer formed on the first nitride semiconductor layer 603 through epitaxial growth and serves as an electron supply layer. The total thickness (the dimension in the z direction) of the buffer layer 602, the first nitride semiconductor layer 603, and the second nitride semiconductor layer 604 is about 2 μm, which is smaller than the thickness of the substrate 601. Two-dimensional electron gas (2DEG) generated in the vicinity of the interface between the first nitride semiconductor layer 603 and the second nitride semiconductor layer 604 is used as a current flow path.

Figure 6:
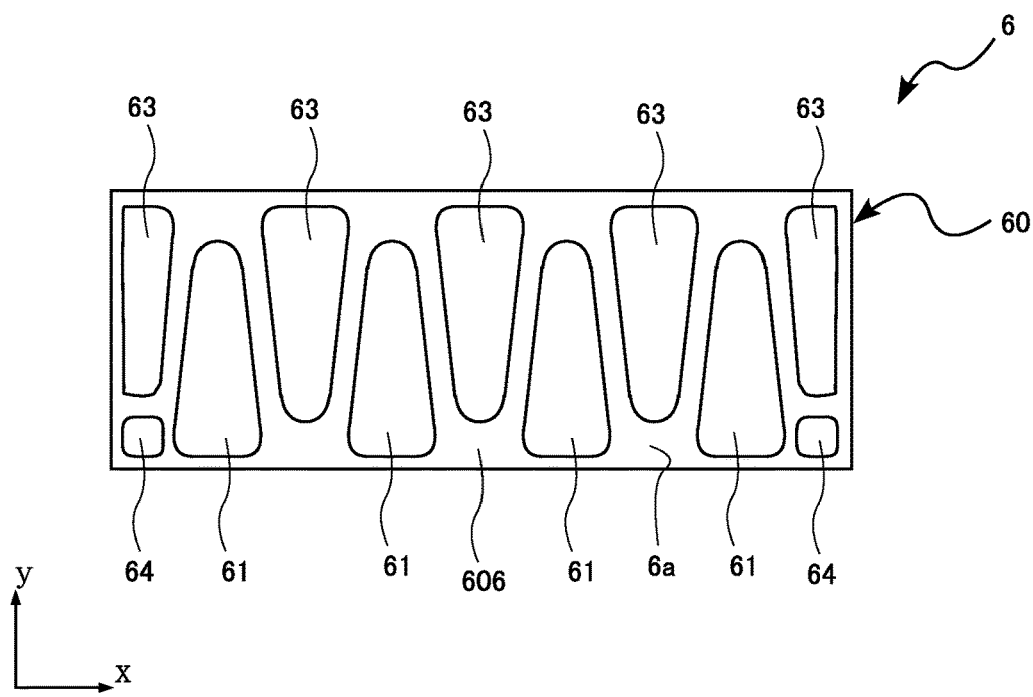
FIG. 6 is a plan view showing a semiconductor element.

The third nitride semiconductor layer 605 is a p-type GaN layer laminated on the second nitride semiconductor layer 604 through epitaxial growth. The fourth electrodes 64 are formed on the third nitride semiconductor layer 605 and functions as gate electrodes. The protective film 606 is, for example, an SiN film, and covers the second nitride semiconductor layer 604, the third nitride semiconductor layer 605, and the fourth electrodes 64. A portion of each of the fourth electrodes 64 is exposed from the protective film 606 (see FIGS. 2 and 6). The first electrodes 61 and the third electrodes 63 are formed on the protective film 606, and portions of the respective first electrodes 61 and third electrodes 63 pass through the protective film 606 to be in contact with the second nitride semiconductor layer 604. The first electrodes 61 and the third electrodes 63 are spaced apart from each other (see FIGS. 2 and 6). The first electrodes 61 are formed so as to cover the third nitride semiconductor layer 605 and the fourth electrodes 64, respectively. The first electrodes 61 function as source electrodes. The third electrodes 63 function as drain electrodes. As shown in FIGS. 2 and 6, the first electrodes 61, the third electrodes 63, and the fourth electrodes 64 are disposed on the obverse surface 6a of the element.

In response to a voltage signal applied to the fourth electrodes (gate electrodes) 64, a current ("main current") flows from the third electrodes (drain electrodes) 63 to the first electrodes 61 (source electrodes). The semiconductor element 6 switches between a state where the main current flows and a state where the main current does not flow. That is, the switching element 6 performs switching of the main current.

The second electrode 62 is formed on the reverse surface (the surface that faces away from the surface on which the buffer layer 602 is formed) of the substrate 601, and is disposed on the reverse surface 6b of the element.

Each conductive portion 607 is, for example, a via hole, and passes through the second nitride semiconductor layer 604, the first nitride semiconductor layer 603, and the buffer layer 602 to reach the substrate 601. The conductive portion 607 is in contact with the portion of the first electrode 61 that passes through the protective film 606 to be electrically connected to the first electrode 61, and is also electrically connected to the second electrode 62 via the substrate 601. Accordingly, the first electrodes 61 and the second electrode 62 are at the same potential. The conductive portion 607 may pass through the substrate 601 to reach the second electrode 62. The configuration of the semiconductor element 6 described above is merely an illustrative example, and the present disclosure is not limited thereto.

Figure 5:
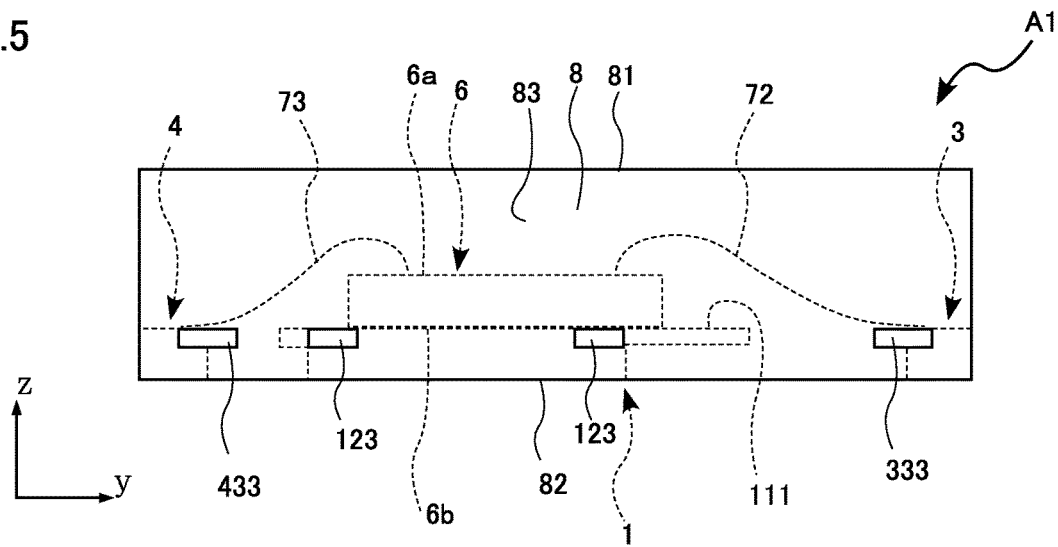
FIG. 5 is a right side view of the semiconductor device shown in FIG. 1.

As shown in FIG. 2, the semiconductor element 6 is mounted in a central portion both in the x direction and the y direction on the obverse surface 111. As shown in FIG. 5, the semiconductor element 6 is mounted on the obverse surface 111 of the first lead 1 in a state where the reverse surface 6b thereof faces the obverse surface 111 with a conductive bonding material interposed between the reverse surface 6b and the obverse surface 111. With this configuration, the second electrode 62 of the semiconductor element 6 is electrically connected to the first lead 1 via a conductive bonding material. Accordingly, the second electrode 62 is at the same potential as the first lead 1. Also, the first electrodes 61 are electrically connected to the second electrode 62 via the conductive portions 607, and thus are at the same potential as the first lead 1.

The plurality of bonding wires 71 are connected to first electrodes 61 of the semiconductor element 6 and to the wire bonding portion obverse surface 211 of the second lead 2. With this configuration, the second lead 2 is electrically connected to the first electrode 61 (source electrode) of the semiconductor element 6 to serve as a source terminal. A main current to be subjected to switching flows through the source terminal. The plurality of bonding wires 72 are connected to the third electrodes 63 of the semiconductor element 6 and the wire bonding portion obverse surface 311 of the third lead 3. With this configuration, the third lead 3 is electrically connected to the third electrode 63 (drain electrodes) of the semiconductor element 6 to serve as a drain terminal. The bonding wire 73 is connected to a fourth electrode 64 of the semiconductor element 6 and the wire bonding portion obverse surface 411 of the fourth lead 4. With this configuration, the fourth lead 4 is electrically connected to a fourth electrode 64 (gate electrode) of the semiconductor element 6 to serve as a gate terminal. The plurality of bonding wires 74 are connected to a first electrode 61 of the semiconductor element 6 and the wire bonding portion obverse surface 511 of the fifth lead 5. With this configuration, the fifth lead 5 is electrically connected to the first electrode 61 (source electrode) of the semiconductor element 6 to serve as a source sense terminal. The source sense terminal is a terminal for detecting the potential of the first electrode 61 (source electrode), and a main current to be subjected to switching does not flow therethrough. Accordingly, the number of bonding wires 74 is smaller than the number of bonding wires 71 through which a main current to be subjected to switching flows. The numbers of the bonding wires 71 to 74 are not limited to the examples illustrated in the drawings. Instead of the bonding wires 71 to 74, metal plates made of Cu or the like may be used, for example.

The sealing resin 8 covers portions of the respective leads 1 to 5, the semiconductor element 6, and the bonding wires 71 to 74. The sealing resin 8 is a black epoxy resin, for example.

The sealing resin 8 has an obverse surface 81, a reverse surface 82, and side surfaces 83. The obverse surface 81 and the reverse surface 82 face away from each other in the z direction. The obverse surface 81 faces upward in FIG. 3, and the reverse surface 82 faces downward in FIG. 3. The side surfaces 83 are surfaces connecting the obverse surface 81 and the reverse surface 82 and face in either the x direction or the y direction. In the example illustrated in the drawings, the side surfaces 83 are four flat surfaces each having a rectangular shape. However, the present disclosure is not limited thereto.

Figure 2:
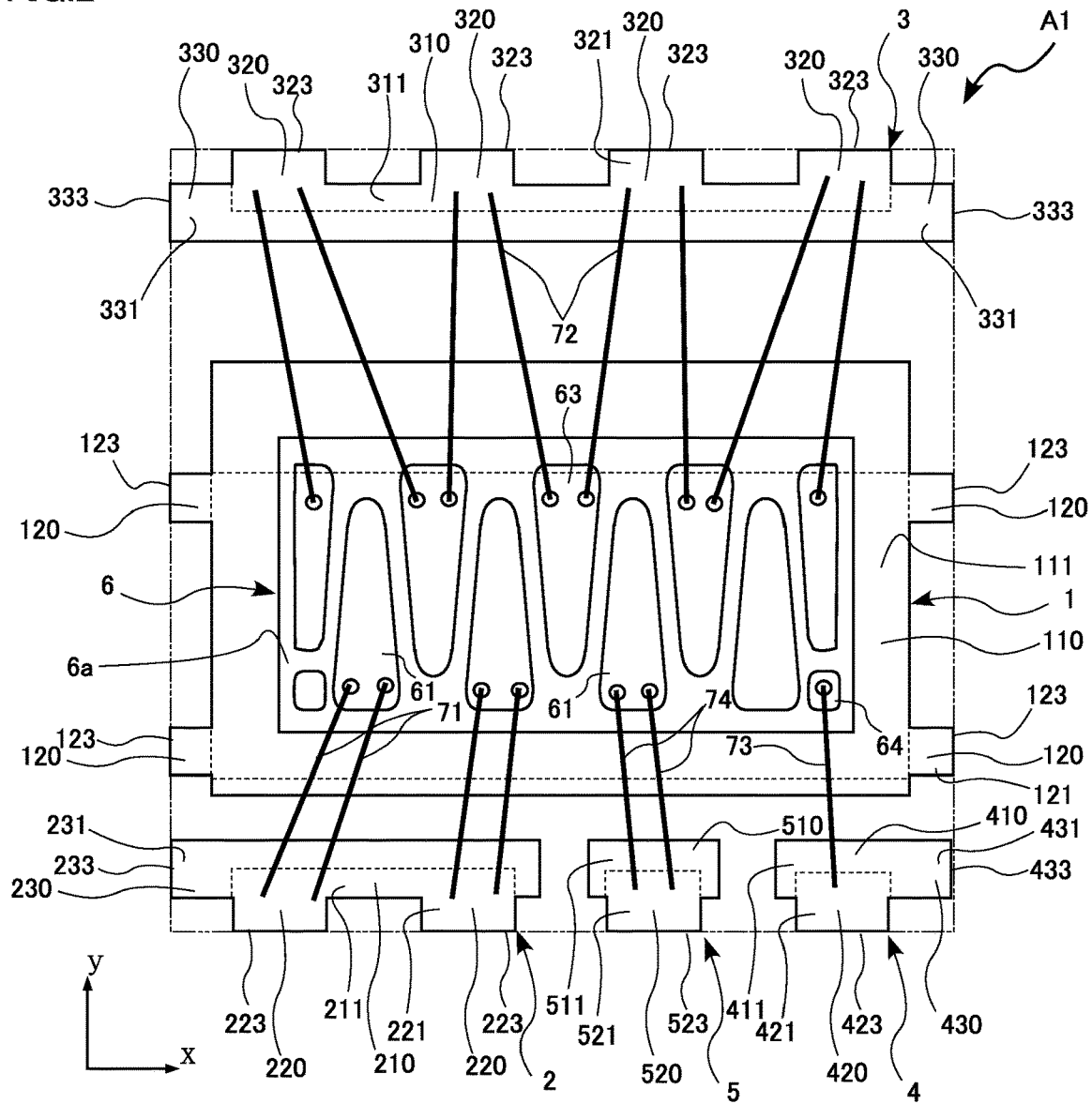
FIG. 2 is a plan view of the semiconductor device shown in FIG. 1.

As shown in FIGS. 1 and 2, the coupling portion end surfaces 123 of the first lead 1, the terminal portion end surfaces 223 and the coupling portion end surface 233 of the second lead 2, the terminal portion end surfaces 323 and the coupling portion end surfaces 333 of the third lead 3, the terminal portion end surface 423 and the coupling portion end surface 433 of the fourth lead 4, and the terminal portion end surface 523 of the fifth lead 5 are flush with the side surfaces 83 of the sealing resin 8. Also, the reverse surface 112 of the first lead 1, the wire bonding portion reverse surface 212 and the terminal portion reverse surfaces 222 of the second lead 2, the wire bonding portion reverse surface 312 and the terminal portion reverse surfaces 322 of the third lead 3, the wire bonding portion reverse surface 412 and the terminal portion reverse surface 422 of the fourth lead 4, and the wire bonding portion reverse surface 512 and the terminal portion reverse surface 522 of the fifth lead 5 are flush with the reverse surface 82 of the sealing resin 8.

An example of a method for producing the semiconductor device A1 will be described with reference to FIGS. 8 and 9.

Figure 8:
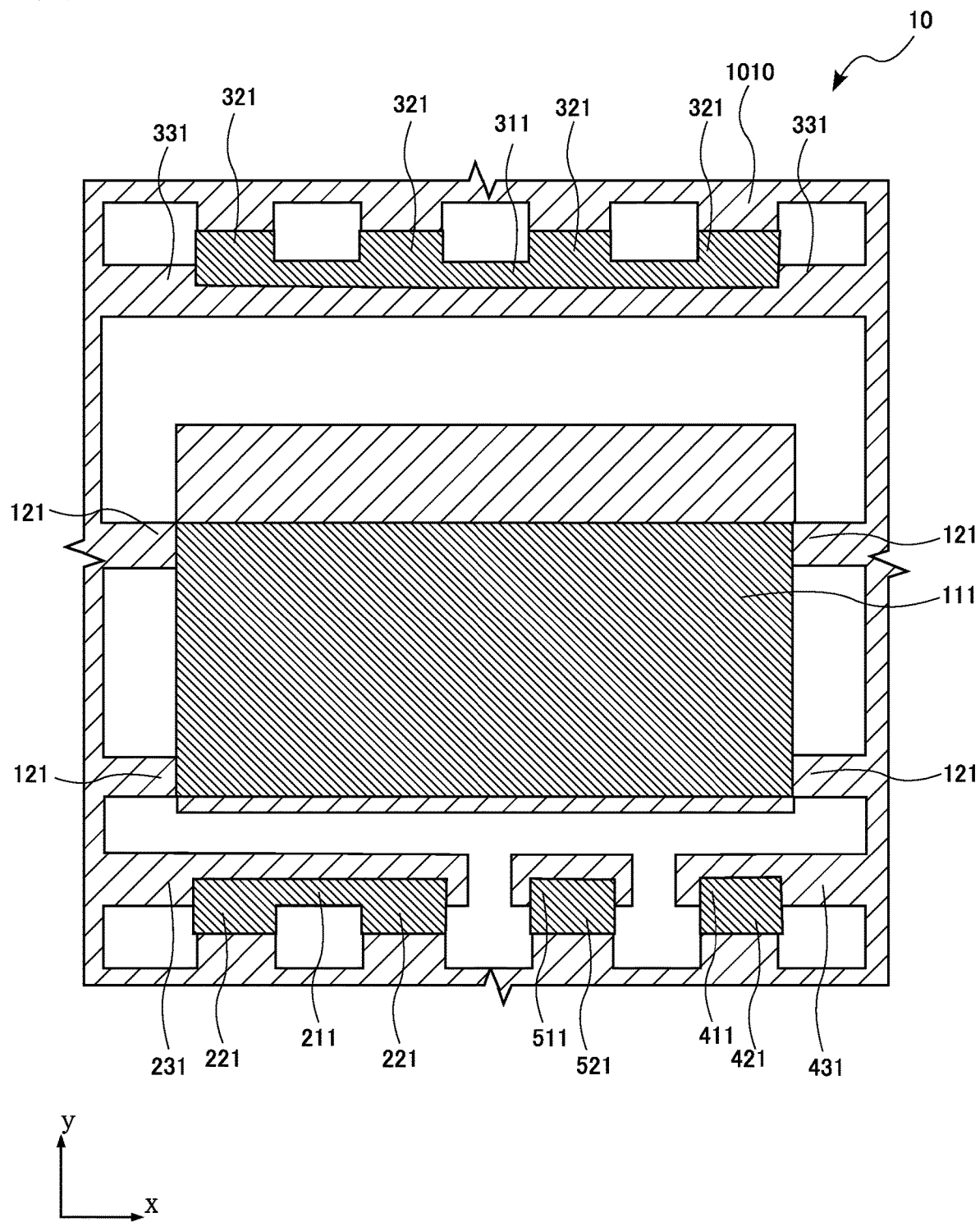
FIG. 8 is a plan view for illustrating a step in a method for producing the semiconductor device shown in FIG. 1.

As shown in FIG. 8, a lead frame 10 is prepared. The lead frame 10 is a plate-shaped material that is to be processed into leads 1 to 5. An obverse surface 1010 of the lead frame 10 is a surface that is processed into the obverse surface 111 and the coupling portion obverse surfaces 121 of the first lead 1, the wire bonding portion obverse surface 211, the terminal portion obverse surfaces 221, and the coupling portion obverse surface 231 of the second lead 2, the wire bonding portion obverse surface 311, the terminal portion obverse surfaces 321, and the coupling portion obverse surfaces 331 of the third lead 3, the wire bonding portion obverse surface 411, the terminal portion obverse surface 421, and the coupling portion obverse surface 431 of the fourth lead 4, and the wire bonding portion obverse surface 511 and the terminal portion obverse surface 521 of the fifth lead 5. The respective portions of the obverse surface 1010 of the lead frame 10 are flush with each other. In FIG. 8, two types of hatching patterns with different line densities are applied to the lead frame 10. Regions with a relatively dense hatching pattern are regions with a greater thickness (the dimension in the z direction). On the other hand, regions with a relatively sparse hatching pattern are regions with a smaller thickness (the dimension in the z direction). These regions are formed by, for example, subjecting the lead frame 10 to half etching. The base material of the lead frame 10 is Cu, for example. However, the present disclosure is not limited thereto.

Figure 9:
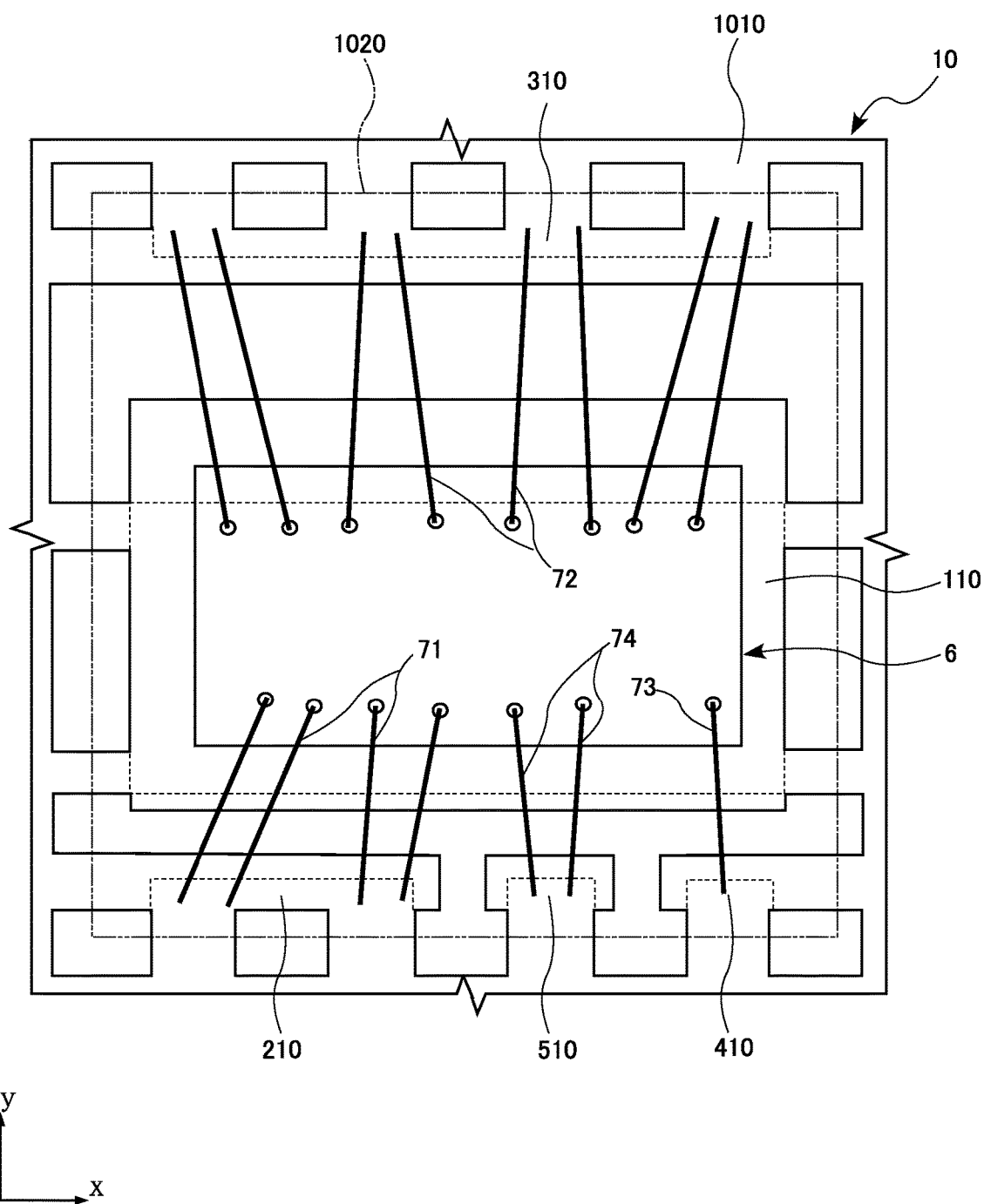
FIG. 9 is a plan view for illustrating another step in the method for producing the semiconductor device shown in FIG. 1.

Next, as shown in FIG. 9, the semiconductor element 6 is bonded to a mounting portion 110 of the lead frame 10 using a conductive bonding material. Thereafter, the bonding wires 71 to 74 are bonded to the respective electrodes of the semiconductor element 6 and the lead frame 10. Subsequently, a resin material is hardened to form a sealing resin (not shown) that covers portions of the lead frame 10, the semiconductor element 6, and the bonding wires 71 to 74. This sealing resin is formed over the entire region shown in FIG. 9, for example. Then, the lead frame 10 and the sealing resin are cut along a cutting line 1020. As a result, the above-described semiconductor device A1 is obtained.

Next, functions and effects of the semiconductor device A1 will be described.

As described above, in the semiconductor device A1, the second electrode 62 of the semiconductor element 6 is connected to the first lead 1, and the first electrodes 61 are connected to the second lead 2 via the bonding wires 71. That is, the semiconductor element 6 is connected to both the first lead 1 and the second lead 2. On the other hand, the first lead 1 and the second lead 2 are spaced apart from each other. With this configuration, a current circulation path including the first lead 1, the second electrode 62, the conductive portions 607, the first electrodes 61, the bonding wires 71, and the second lead 2 is not formed. Accordingly, a current is kept from flowing along the lamination direction (z direction) of the second nitride semiconductor layer 604 and the first nitride semiconductor layer 603. As a result, undesirable changes in properties of the second nitride semiconductor layer 604 and the first nitride semiconductor layer 603 are suppressed, which contributes to improvement in the long-term reliability of the semiconductor element 6.

In the semiconductor device A1, the separation distance between the third lead 3 and the first lead 1 is greater than the separation distance between the second lead 2 (or the fifth lead 5 and the fourth lead 4) and the first lead 1. Such a configuration helps to increase the dielectric strength between the first lead 1 and the third lead 3, to which a relatively high voltage is applied.

In the semiconductor device A1, the reverse surface 112 of the first lead 1 is exposed from the reverse surface 82 of the sealing resin 8. With this configuration, the first lead 1 functions as a back terminal when the semiconductor device A1 is mounted on a circuit board or the like, and also functions as a heat dissipator for dissipating heat generated by the semiconductor element 6. The semiconductor device A1 includes the fifth lead 5 in addition to the second lead 2. With this configuration, the semiconductor device A1 can have, in addition to a source terminal (the second lead 2) through which a main current to be subjected to switching flows, a source sense terminal (the fifth lead 5 through which a main current does not flow) for detecting the electric potential of the source electrodes (the first electrodes 61). Also, by setting the number of bonding wires 71 connected to the second lead 2 to be larger than the number of bonding wires 74 connected to the fifth lead 5, the resistance to a current that flows via the second lead 2 can be set low. Also, the number of terminal portions 220 of the second lead 2 is larger than the number of terminal portions 520 of the fifth lead 5, and the second lead 2 has a larger dimension in the x direction than the fifth lead 5 does. With such a configuration, the cross-sectional area of the current path can be relatively increased, whereby the resistance to a current that flows through the second lead 2 can be reduced.

Figure 10:
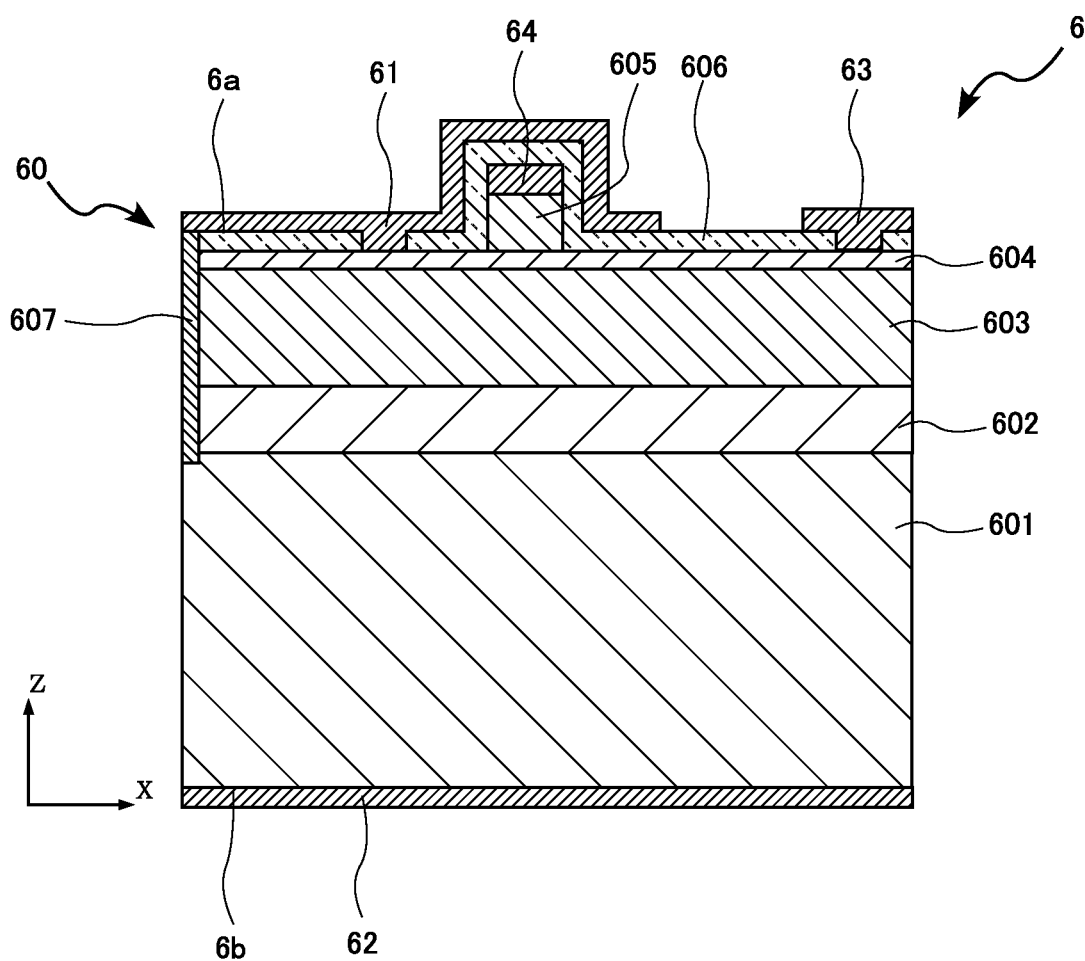
FIG. 10 shows a modification of the semiconductor element shown in FIGS. 6 and 7.

Although an example where the semiconductor element 6 is a HEMT has been described above, the present disclosure is not limited thereto. The configuration of the semiconductor element 6 is not limited as long as the first electrodes 61 disposed on the obverse surface 6a and the second electrode 62 disposed on the reverse surface 6b are electrically connected to each other via the conductive portions 607. The conductive portion 607 is not limited to a via hole as long as it allows electrical communication between the first electrode 61 and the second electrode 62. For example, as shown in FIG. 10, the conductive portion 607 may be formed on a side surface of the element body 60.

In the above-described example, the coupling portion end surfaces 123 of the first lead 1, the terminal portion end surfaces 223 and the coupling portion end surface 233 of the second lead 2, the terminal portion end surfaces 323 and the coupling portion end surfaces 333 of the third lead 3, the terminal portion end surface 423 and the coupling portion end surface 433 of the fourth lead 4, and the terminal portion end surface 523 of the fifth lead 5 are flush with the side surfaces 83 of the sealing resin 8. However, the present disclosure is not limited thereto. These end surfaces may protrude from the side surfaces 83 or may be recessed inward from the side surfaces 83. Each of the end surfaces may be flat, curved, or have recesses and protrusions.

Figure 11:
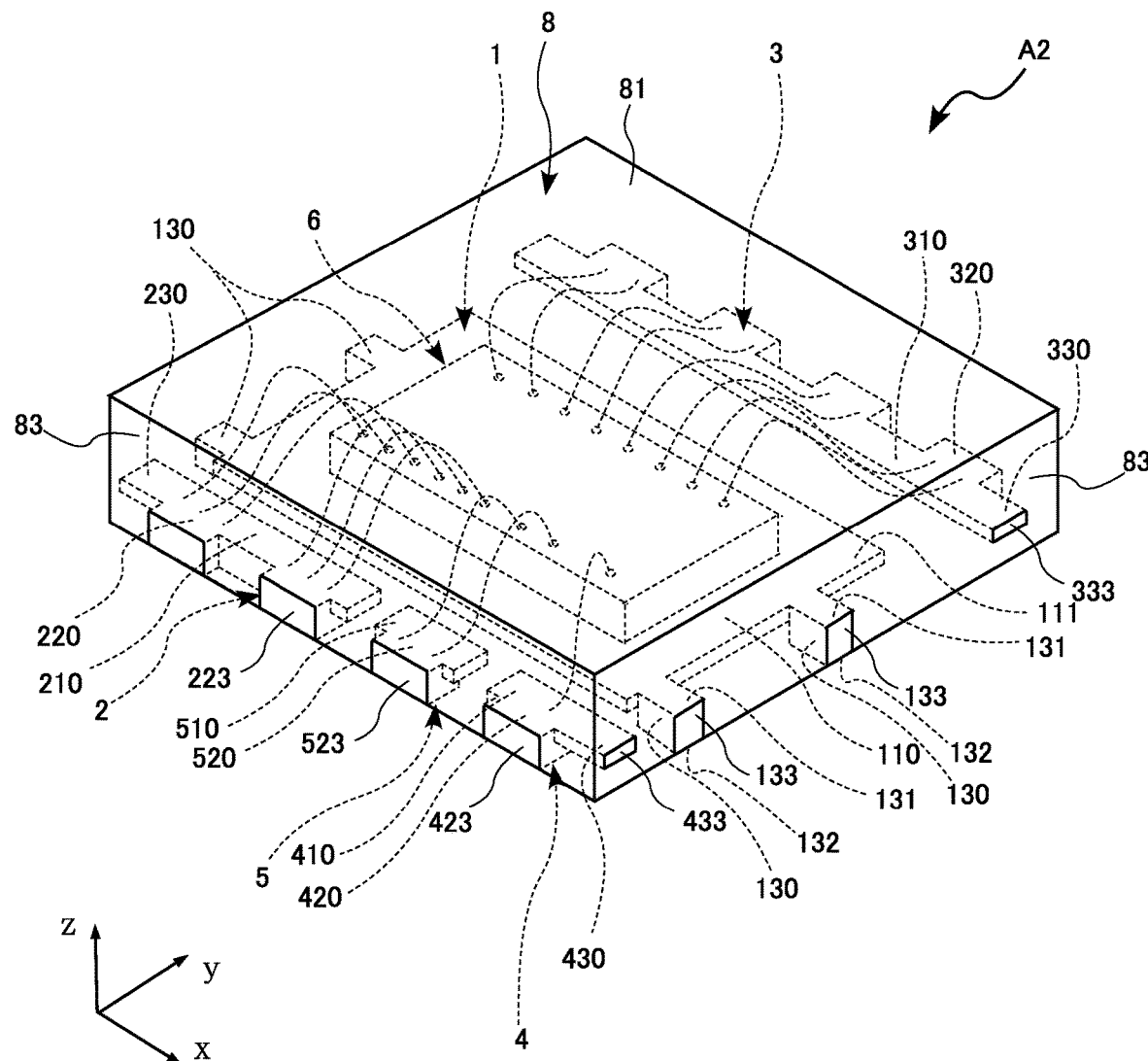
FIG. 11 is a perspective view showing a semiconductor device according to Example 2.
Figure 12:
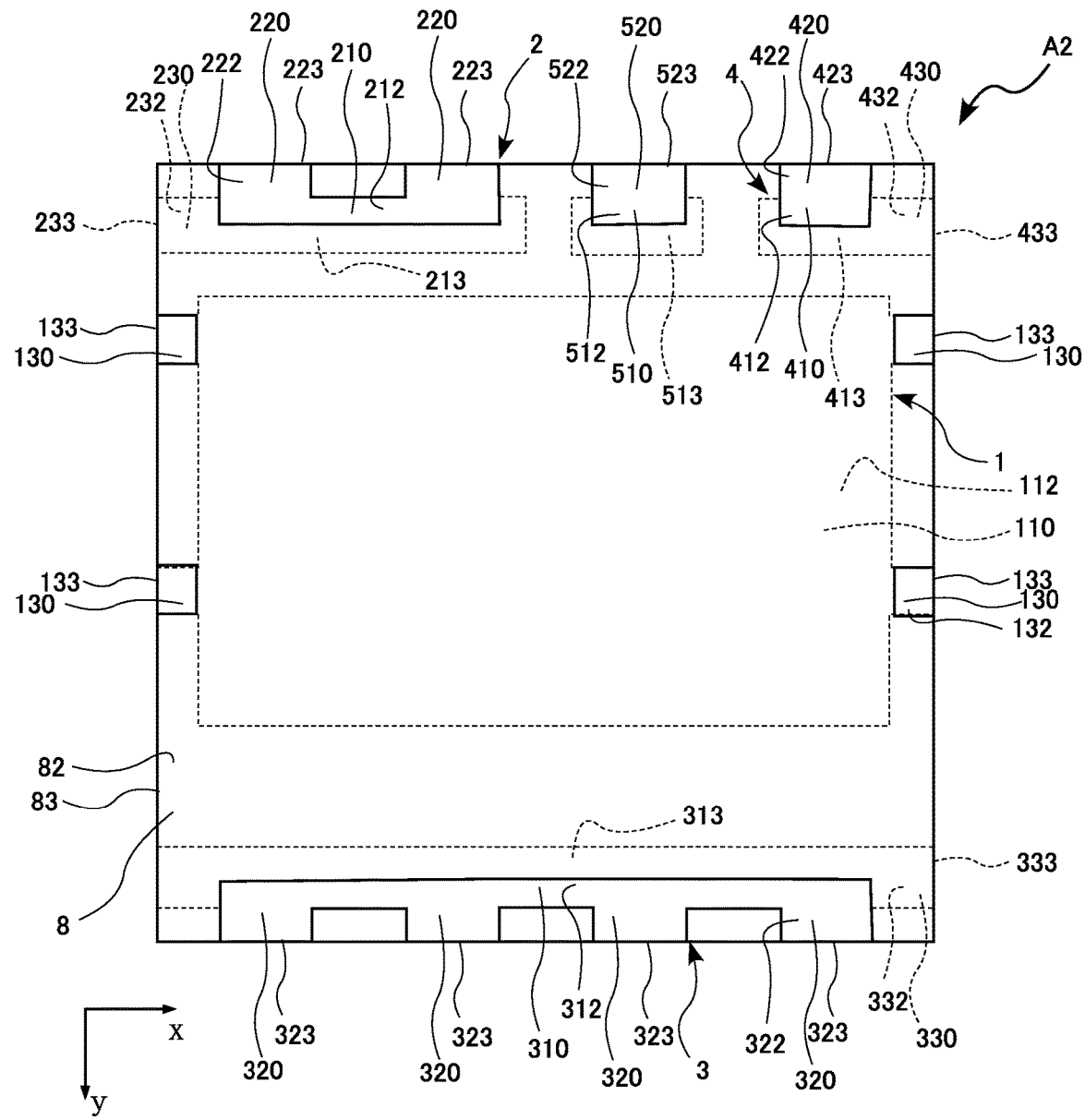
FIG. 12 is a bottom view of the semiconductor device shown in FIG. 11.

A semiconductor device A2 according to Example 2 will be described with reference to FIGS. 11 and 12. In these drawings, components that are identical or similar to those of the above-described semiconductor device A1 are given the same reference signs, and redundant explanations thereof are omitted as appropriate.

In the semiconductor device A2, the shape of a first lead 1 is different from that in the semiconductor device A1. In the semiconductor device A2, a surface of the first lead 1 that faces away from an obverse surface 111 does not have a portion corresponding to the reverse surface 112 in Example 1, and the entire surface forms a recess 113 (or it can be said that the surface is not provided with a recess and is entirely flat). Accordingly, a mounting portion 110 is not exposed from a reverse surface 82 of a sealing resin 8. Further, the first lead 1 includes terminal portions 130 instead of the coupling portions 120. Each terminal portion 130 has an obverse surface 131, a reverse surface 132, and an end surface 133. The obverse surface 131 and the reverse surface 132 face away from each other in the z direction. The obverse surface 131 faces upward in FIG. 11. The obverse surface 131 of the terminal portion and the obverse surface 111 are flush with each other. The reverse surface 132 of each terminal portion faces downward in FIG. 11. The thickness (the dimension in the z direction) of each terminal portion 130 is about twice as great as that of the mounting portion 110, and the reverse surface 132 of each terminal portion is exposed from the reverse surface 82 of the sealing resin 8. The end surface 133 of the terminal portion is a surface connecting the obverse surface 131 and the reverse surface 132, and faces outward in the x direction. The reverse surface 132 and the end surface 133 are exposed from the sealing resin 8 and connected to each other to function as a terminal.

Also, in the semiconductor device A2, the first lead 1 and the second lead 2 are spaced apart from each other. Accordingly, a current circulation path, which has conventionally been a problem, is not formed, whereby a current is kept from flowing along the lamination direction (z direction) of nitride semiconductor layers 603 and 604. This improves the long-term reliability of the semiconductor element 6.

In the semiconductor device A2, the first lead 1 includes, as terminals, the terminal portions 130 exposed from the sealing resin 8. Each terminal portion 130 is a terminal configured such that it has the end surface 133 exposed from a side surface 83 of the sealing resin and the reverse surface 132 exposed from the reverse surface 82 of the sealing resin and the end surface 133 and the reverse surface 132 are connected to each other. When the semiconductor device A2 is mounted on a circuit board, these terminals are joined to circuit wiring formed on the circuit board through soldering. Since solder fillets are formed on the end faces 133 of the terminal portions, whether the terminal portions 130 are joined to the circuit wiring can be visually confirmed.

Figure 13:
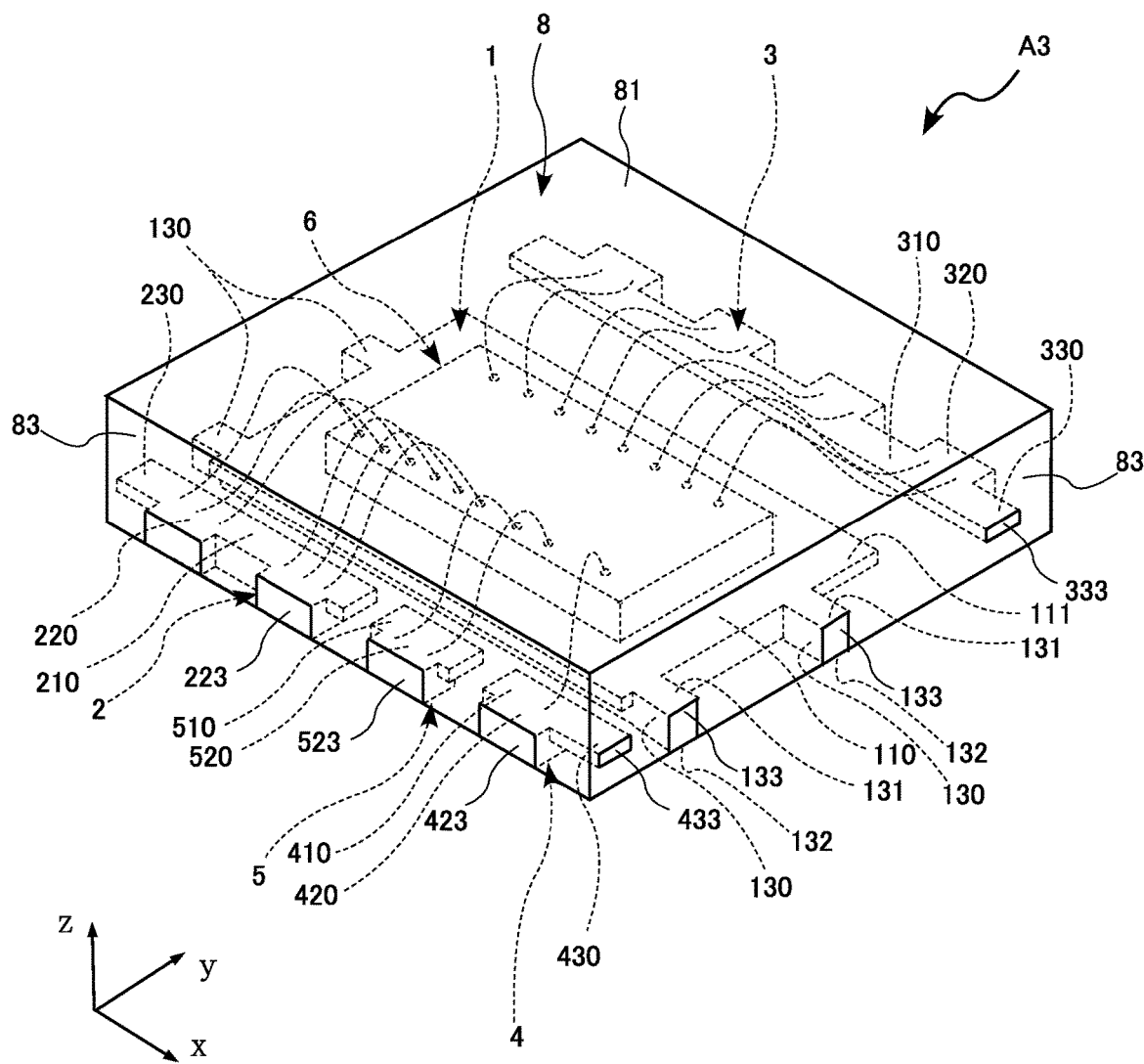
FIG. 13 is a perspective view showing a semiconductor device according to Example 3.
Figure 14:
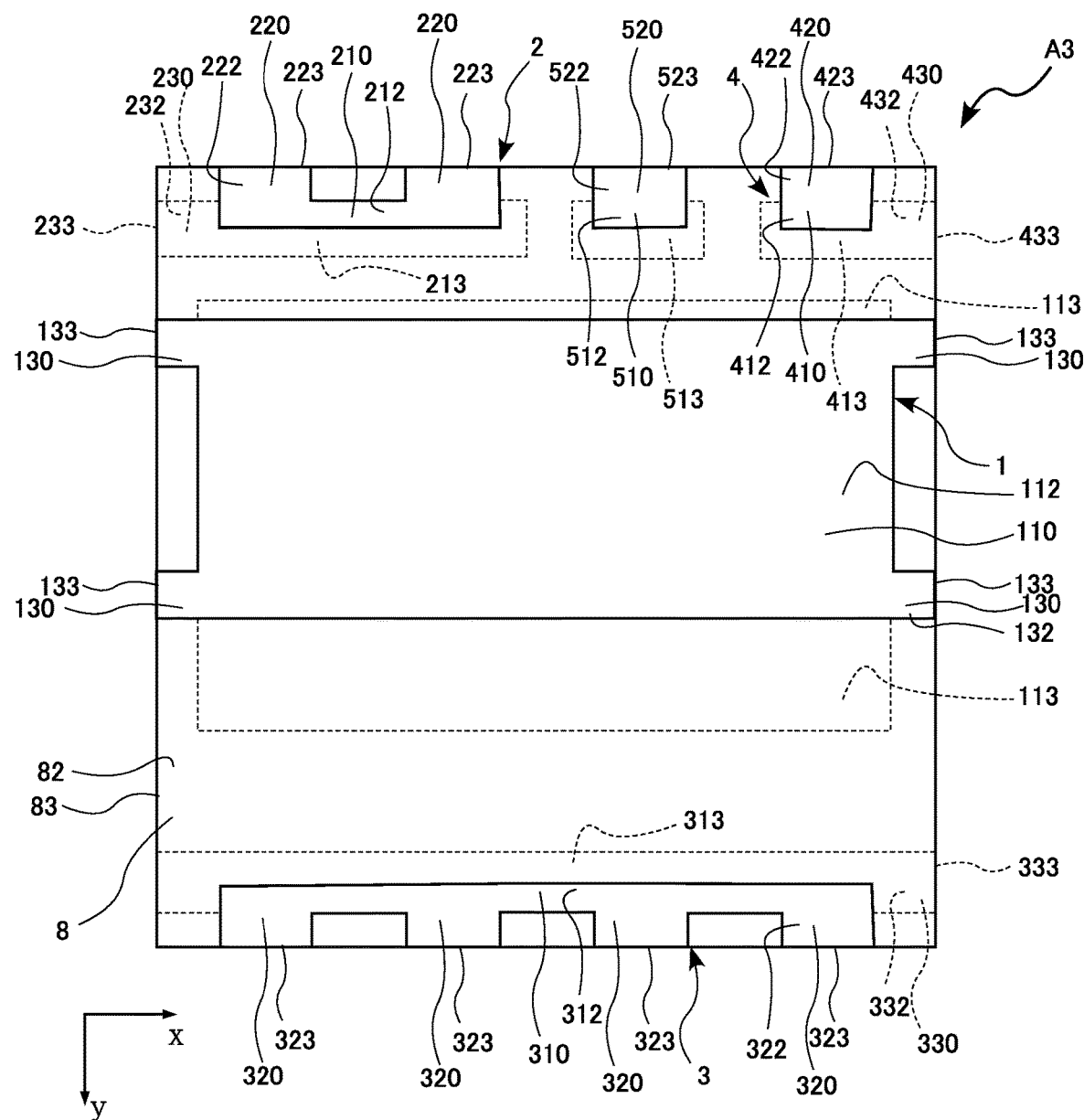
FIG. 14 is a bottom view of the semiconductor device shown in FIG. 13.

A semiconductor device A3 according to Example 3 will be described with reference to FIGS. 13 and 14. In these drawings, components that are identical or similar to those of the above-described semiconductor device A1 are given the same reference signs, and redundant explanations thereof are omitted as appropriate.

In the semiconductor device A3, the shape of a first lead 1 is different from that in the semiconductor device A1. The first lead 1 of the semiconductor device A3 includes terminal portions 130 that are similar to those in the semiconductor device A2. The configuration of the terminal portions 130 is similar to that of the terminal portions 130 in Example 2. In the semiconductor device A3, reverse surfaces 132 of the terminal portions are flush with a reverse surface 112. The reverse surface 112, the reverse surfaces 132 of the terminal portions, and end surfaces 133 of the terminal portions are exposed from a sealing resin 8 and connected to each other to function as terminals.

Also, in the semiconductor device A3, the first lead 1 and a second lead 2 are spaced apart from each other, and a current circulation path is thus not formed. Accordingly, a current is kept from flowing along the lamination direction (z direction) of nitride semiconductor layers 603 and 604, which improves the long-term reliability of a semiconductor element 6.

In the semiconductor device A3, the first lead 1 has the terminal portions 130 exposed from the sealing resin 8 and the reverse surface 112 is exposed from a reverse surface 82 of the sealing resin 8. Accordingly, the joined state of the first lead 1 can be checked based on the appearance thereof after mounting the semiconductor device A3 on a circuit board, and further, the first lead 1 can also function as a heat dissipator for dissipating heat generated by the semiconductor element 6.

Figure 15:
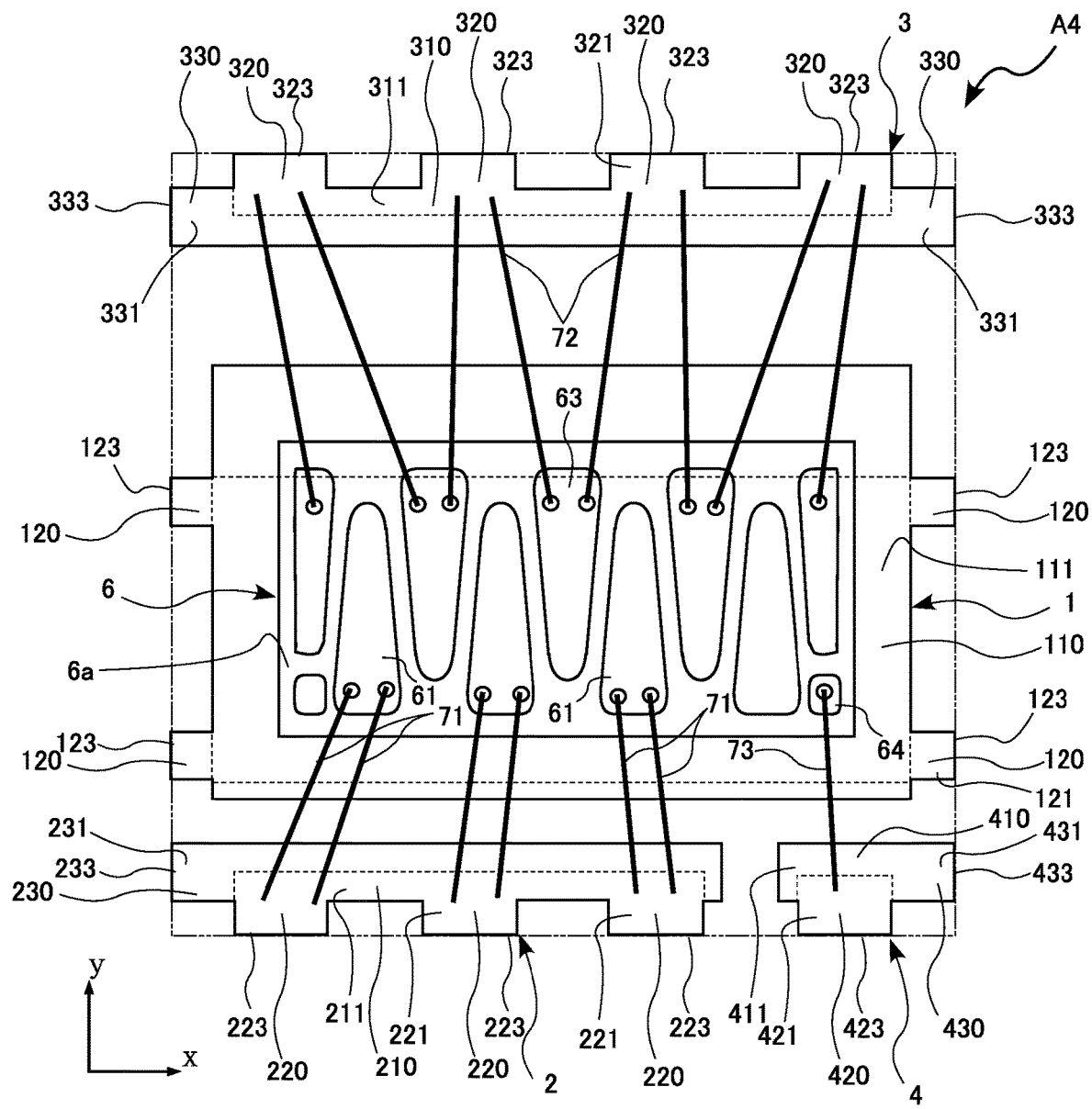
FIG. 15 is a plan view showing a semiconductor device according to Example 4.

A semiconductor device A4 according to Example 4 will be described with reference to FIG. 15. In FIG. 15, components that are identical or similar to those of the above-described semiconductor device A1 are given the same reference signs, and redundant explanations thereof are omitted. In FIG. 15, for the sake of convenience in understanding, a sealing resin 8 is not shown and the outer shape thereof is indicated with an imaginary line (double-dot-dash line).

The semiconductor device A4 is different from the semiconductor device A1 in that it does not include a source sense terminal (fifth lead 5). A second lead 2 of the semiconductor device A4 extends to a position near a fourth lead 4 in the x direction, and includes three terminal portions 220. The semiconductor device A4 may also be configured such that the second lead 2 is the same as the second lead 2 in the semiconductor device A1 and does not include the fifth lead 5 in the semiconductor device A1.

Also, in the semiconductor device A4, a first lead 1 and the second lead 2 are spaced apart from each other, and a current circulation path is thus not formed. Accordingly, a current is kept from flowing along the lamination direction (z direction) of nitride semiconductor layers 603 and 604, which improves the long-term reliability of a semiconductor element 6.

Figure 16:
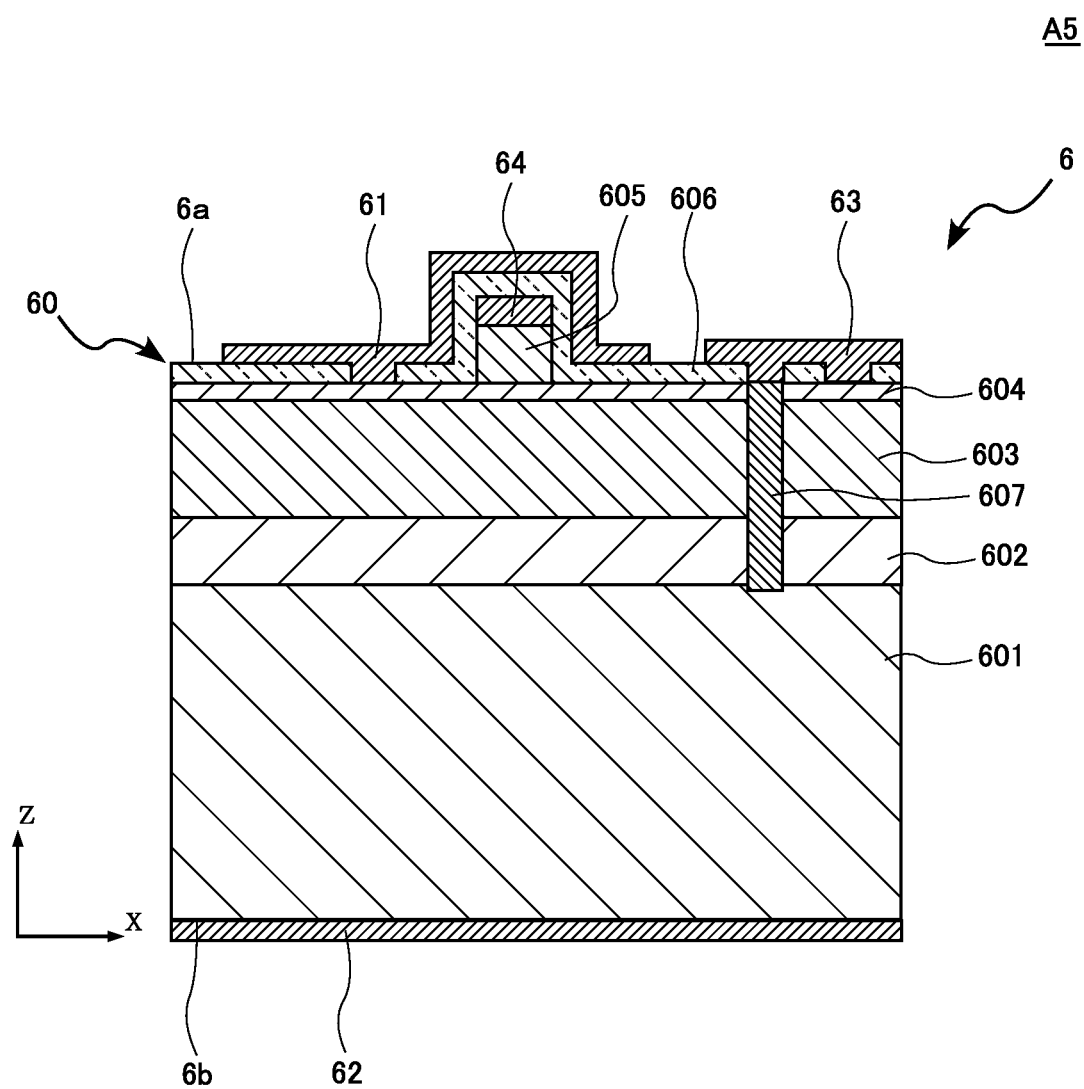
FIG. 16 is a schematic cross-sectional view showing a semiconductor element used in a semiconductor device according to Example 5.

A semiconductor device A5 according to Example 5 will be described with reference to FIG. 16. In FIG. 16, components that are identical or similar to those of the above-described semiconductor device A1 are given the same reference signs, and redundant explanations thereof are omitted as appropriate.

The semiconductor device A5 is different from the semiconductor device A1 in that a semiconductor element 6 is configured such that conductive portions 607 are in contact with third electrodes 63 instead of with first electrodes 61 and electrically connected to the third electrodes 63. In the semiconductor device A5, the conductive portions 607 are electrically connected to the third electrodes 63 and also electrically connected to a second electrode 62 via a substrate 601. Accordingly, the third electrodes 63 and the second electrode 62 are at the same potential. The second electrode 62 of the semiconductor element 6 is electrically connected to a first lead 1 using a conductive bonding material. Accordingly, the second electrode 62 of the semiconductor element 6 is at the same potential as the first lead 1. The third electrodes 63 are electrically connected to the second electrode 62 via the conductive portions 607 and thus are at the same potential as the first lead 1.

In the semiconductor device A5, the first lead 1 and the third lead 3 are spaced apart from each other. Accordingly, even if the second electrode 62 of the semiconductor element 6 is connected to the first lead 1 and if the third electrodes 63 and the third lead 3 are connected by bonding wires 72, a current circulation path including the first lead 1, the second electrode 62, the conductive portions 607, the third electrodes 63, the bonding wires 72, and the third lead 3 is not formed. Accordingly, a current is kept from flowing along the lamination direction (z direction) of a second nitride semiconductor layer 604, a first nitride semiconductor layer 603, and a buffer layer 602, which improves the long-term reliability of the semiconductor element 6.

Figure 17:
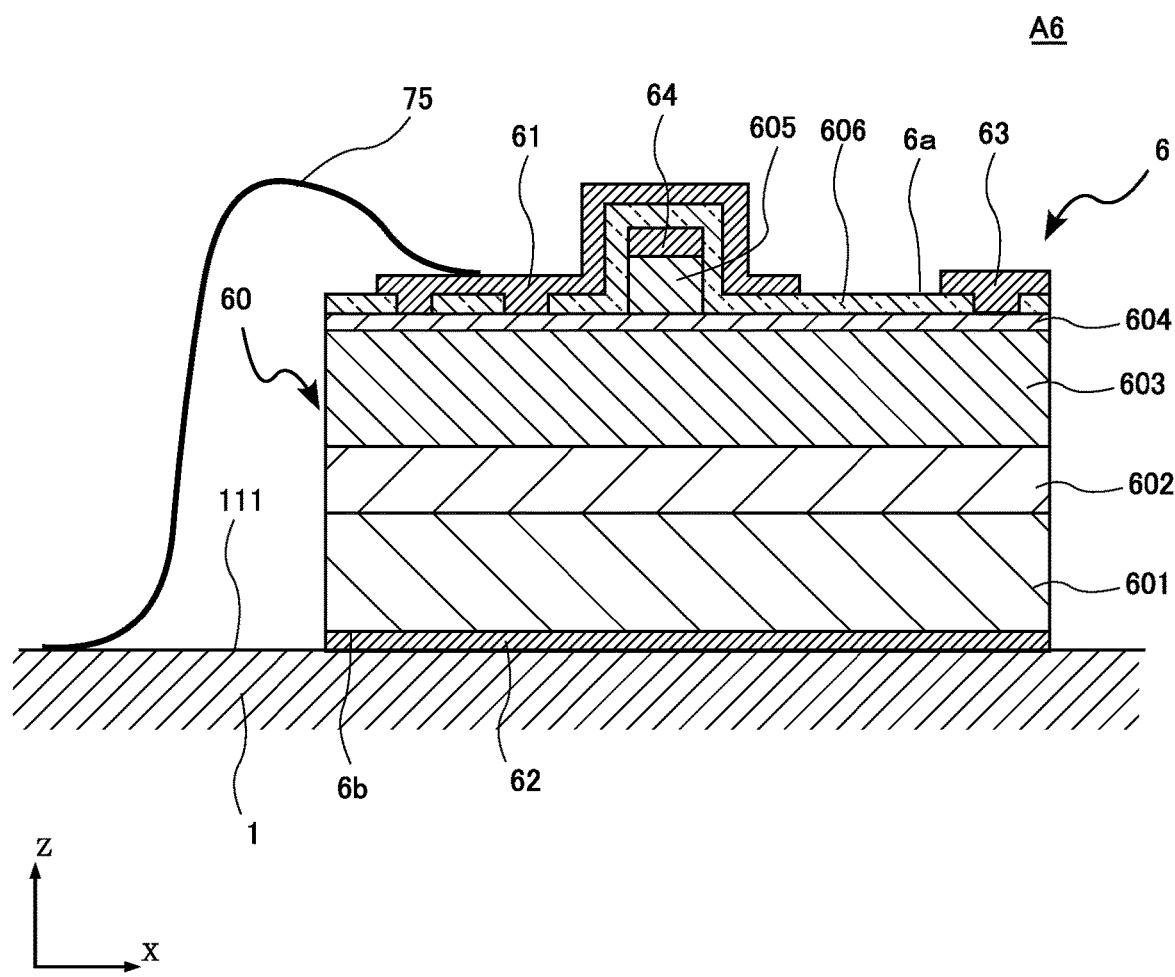
FIG. 17 is a schematic cross-sectional view showing a semiconductor element used in a semiconductor device according to Example 6.

A semiconductor device A6 according to Example 6 will be described with reference to FIG. 17. In FIG. 17, components that are identical or similar to those of the above-described semiconductor device A1 are given the same reference signs, and redundant explanations thereof are omitted as appropriate.

In the semiconductor device A6, a semiconductor element 6 does not include a conductive portion 607, and first electrodes 61 and a first lead 1 are connected to each other by bonding wires 75. The bonding wires 75 are connected to the first electrodes 61 of the semiconductor element 6 and an obverse surface 111 of the first lead 1. With this configuration, the first lead 1 is at the same potential as the first electrodes 61 of the semiconductor element 6. A second electrode 62 is connected to the first lead 1 using a conductive bonding material, and is at the same potential as the first lead 1. Accordingly, the first electrodes 61 and the second electrode 62 are electrically connected to each other and are at the same potential.

Also, in the semiconductor device A6, the first lead 1 and a second lead 2 are spaced apart from each other, and a current circulation path, which has conventionally been a problem, is not formed. Accordingly, the semiconductor device A6 can exhibit effects similar to those in Example 1.

The semiconductor device according to the present disclosure is not limited to the above-described examples. Various modifications in design may be made freely in the specific structure of each part of the semiconductor device according to the present disclosure.

The invention claimed is:

1. A semiconductor device comprising:
   a first lead;
   a semiconductor element mounted on the first lead and having an element obverse surface and an element reverse surface that are spaced apart from each other in a thickness direction, the semiconductor element including: an electron transit layer that is disposed closer to the element obverse surface than to the element reverse surface and is formed of a first nitride semiconductor; an electron supply layer that is disposed between the electron transit layer and the element obverse surface and is formed of a second nitride semiconductor different from the first nitride semiconductor; a gate electrode; a first electrode and a second electrode that are disposed on the element obverse surface and include a first connecting portion and a second connecting portion, respectively, that are electrically connected to the electron supply layer and are separated from each other with the gate electrode intervening therebetween in a cross-sectional view; a third electrode disposed on the element reverse surface and bonded to the first lead;
   a second lead electrically connected to the second electrode and configured to pass an electric current subjected to switching between the first electrode and the second electrode based on control by the gate electrode; and
   a connecting member that electrically connects the first electrode and the third electrode to each other, the connecting member including a first end bonded to the first electrode and a second end bonded to the first lead.

2. The semiconductor device according to claim 1, wherein the connecting member comprises a wire.

3. The semiconductor device according to claim 1, further comprising a sealing resin that covers the semiconductor element, wherein the first lead has a reverse surface that is located opposite to the semiconductor element, and at least a part of the reverse surface of the first lead is exposed from the sealing resin.

4. The semiconductor device according to claim 3, wherein the sealing resin comprises a first resin side surface and a second resin side surface, the second lead being disposed closer to the first resin side surface than to the second resin side surface,
   the first lead comprises an auxiliary portion having an end face exposed from the second resin side surface.

5. The semiconductor device according to claim 4, wherein the auxiliary portion has a reverse surface opposite to the semiconductor element in the thickness direction, and an entirety of the reverse surface of the auxiliary portion is covered with the sealing resin.

6. The semiconductor device according to claim 3, wherein the second lead comprises a plurality of terminals that are exposed from the sealing resin and are electrically connected to each other within the sealing resin.

7. The semiconductor device according to claim 1, further comprising a third lead and a fourth lead,
   wherein the semiconductor element is provided with a third electrode and a fourth electrode disposed on the element obverse surface, the third lead is electrically connected to the third electrode, and the fourth lead is electrically connected to the fourth electrode.

8. The semiconductor device according to claim 7, wherein the second lead and the third lead are disposed opposite to each other with respect to the first lead in plan view.

9. The semiconductor device according to claim 7, wherein a separation distance between the first lead and the third lead is greater than a separation distance between the first lead and the second lead in plan view.

10. The semiconductor device according to claim 7, wherein the third lead and the fourth lead are disposed opposite to each other with respect to the first lead in plan view.

11. A semiconductor device comprising:
    a first lead;
    a semiconductor element mounted on the first lead and having an element obverse surface and an element reverse surface that are spaced apart from each other in a thickness direction, the semiconductor element including: an electron transit layer that is disposed closer to the element obverse surface than to the the element reverse surface and is formed of a first nitride semiconductor; an electron supply layer that is disposed between the electron transit layer and the element obverse surface and is formed of a second nitride semiconductor different from the first nitride semiconductor; a gate electrode; a first electrode and a second electrode that are disposed on the element obverse surface and include a first connecting portion and a second connecting portion, respectively, that are electrically connected to the electron supply layer and are separated from each other with the gate electrode intervening therebetween in a cross-sectional view; a third electrode disposed on the element reverse surface and bonded to the first lead;
- a second lead electrically connected to the second electrode and configured to pass an electric current subjected to switching between the first electrode and the second electrode based on control by the gate electrode; and
- a connecting portion to electrically connect the first electrode and the third electrode, the connecting portion being configured to extend in the thickness direction and pass at least the electron supply layer and the electron transit layer.

12. The semiconductor device according to claim 11, wherein the connecting portion is embedded in the semiconductor element and is configured to penetrate through the electron supply layer and the electron transit layer.

13. The semiconductor device according to claim 11, wherein the connecting portion is disposed on a side surface of the semiconductor element.

14. The semiconductor device according to claim 11, further comprising a sealing resin that covers the semiconductor element, wherein the sealing resin comprises a first resin side surface and a second resin side surface, the second lead being disposed closer to the first resin side surface than to the second resin side surface,
the first lead comprises an auxiliary portion having an end face exposed from the second resin side surface.

15. The semiconductor device according to claim 14, wherein the auxiliary portion has a reverse surface opposite to the semiconductor element in the thickness direction, and an entirety of the reverse surface of the auxiliary portion is covered with the sealing resin.

16. The semiconductor device according to claim 14, wherein the second lead comprises a plurality of terminals that are exposed from the sealing resin and are electrically connected to each other within the sealing resin.

17. The semiconductor device according to claim 11, further comprising a third lead and a fourth lead,
wherein the semiconductor element is provided with a third electrode and a fourth electrode disposed on the element obverse surface, the third lead is electrically connected to the third electrode, and the fourth lead is electrically connected to the fourth electrode.

18. The semiconductor device according to claim 17, wherein the second lead and the third lead are disposed opposite to each other with respect to the first lead in plan view.

19. The semiconductor device according to claim 17, wherein a separation distance between the first lead and the third lead is greater than a separation distance between the first lead and the second lead in plan view.

20. The semiconductor device according to claim 17, wherein the third lead and the fourth lead are disposed opposite to each other with respect to the first lead in plan view.

* * * * *